United States Patent
Ho et al.

(10) Patent No.: US 7,924,600 B2
(45) Date of Patent: *Apr. 12, 2011

(54) METHODS OF OPERATING A BISTABLE RESISTANCE RANDOM ACCESS MEMORY WITH MULTIPLE MEMORY LAYERS AND MULTILEVEL MEMORY STATES

(75) Inventors: ChiaHua Ho, Kaoshing (TW); Erh-Kun Lai, Elmsford, NY (US); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/511,846

(22) Filed: Jul. 29, 2009

(65) Prior Publication Data

US 2009/0303774 A1    Dec. 10, 2009

Related U.S. Application Data

(63) Continuation of application No. 12/134,117, filed on Jun. 5, 2008, now Pat. No. 7,586,778, which is a continuation of application No. 11/552,464, filed on Oct. 24, 2006, now Pat. No. 7,388,771.

(51) Int. Cl.
    *G11C 11/00* (2006.01)
(52) U.S. Cl. ........................ 365/148; 365/163
(58) Field of Classification Search .................. 365/100, 365/113, 168
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 5,166,096 | A | 11/1992 | Cote et al. |
| 5,166,758 | A | 11/1992 | Ovshinsky et al. |
| 5,177,567 | A | 1/1993 | Klersy et al. |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — Tan T. Nguyen
(74) *Attorney, Agent, or Firm* — Haynes Beffel & Wolfeld

(57) ABSTRACT

A method is described for operating a bistable resistance random access memory having two memory layer stacks that are aligned in series is disclosed. The bistable resistance random access memory comprises two memory layer stacks per memory cell, the bistable resistance random access memory operates in four logic states, a logic "00" state, a logic "01" state, a logic "10" state and a logic "11" state. The relationship between the four different logic states can be represented mathematically by the two variables n and f and a resistance R. The logic "0" state is represented by a mathematical expression $(1+f)R$. The logic "1" state is represented by a mathematical expression $(n+f)R$. The logic "2" state is represented by a mathematical expression $(1+nf)R$. The logic "3" state is represented by a mathematical expression $n(1+f)R$.

14 Claims, 18 Drawing Sheets

U.S. PATENT DOCUMENTS

| | | |
|---|---|---|
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,646,906 B2 | 11/2003 | Salling |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,805,563 B2 | 10/2004 | Ohashi |
| 6,815,704 B1 | 11/2004 | Chen |
| 6,852,550 B2 | 2/2005 | Tuttle et al. |
| 6,859,389 B2 | 2/2005 | Idehara |
| 6,861,267 B2 | 3/2005 | Xu et al. |
| 6,862,212 B2 * | 3/2005 | Nickel et al. ............... 365/158 |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,909,107 B2 | 6/2005 | Rodgers et al. |
| 6,911,710 B2 * | 6/2005 | Nickel et al. ............... 257/421 |
| 6,927,410 B2 | 8/2005 | Chen |
| 6,927,995 B2 * | 8/2005 | Nickel et al. ............... 365/158 |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,042,001 B2 | 5/2006 | Kim et al. |
| 7,075,813 B2 | 7/2006 | Moriyama et al. |
| 7,106,623 B2 | 9/2006 | Hung et al. |
| 7,132,675 B2 | 11/2006 | Gilton |
| 7,254,050 B2 | 8/2007 | King |
| 7,369,431 B2 | 5/2008 | Muraoka et al. |
| 7,388,771 B2 | 6/2008 | Ho et al. |
| 7,701,750 B2 * | 4/2010 | Shih et al. ............... 365/148 |
| 2004/0248339 A1 | 12/2004 | Lung |
| 2005/0093022 A1 | 5/2005 | Lung |
| 2005/0215009 A1 | 9/2005 | Cho |
| 2007/0158690 A1 | 7/2007 | Ho et al. |
| 2007/0161186 A1 | 7/2007 | Ho |
| 2007/0173019 A1 | 7/2007 | Ho et al. |
| 2007/0257300 A1 | 11/2007 | Ho et al. |
| 2008/0157053 A1 | 7/2008 | Lai et al. |

FOREIGN PATENT DOCUMENTS

| | | |
|---|---|---|
| WO | WO-0145108 | 6/2001 |

OTHER PUBLICATIONS

"New Memories Tap Spin, Gird for Battle," Science News, Apr. 3, 1999, p. 223, vol. 155.

"Remembering on the Cheap," www.sciencenews.org, Mar. 19, 2005, p. 189, vol. 167.

Adler, D. et al., "Threshold Switching in Chalcogenide-Glass Thin Films," J. Appl/ Phys 51(6), Jun. 1980, pp. 3289-3309.

Adler, David, "Amorphous-Semiconductor Devices," Sci. Amer., vol. 236, pp. 36-48, May 1997.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Utrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3.sup.rd EPCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 .mu.m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992. pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43.sup.rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel .mu.Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21.sub.—Tyson.sub.—P.PD-F#search='nonvolatile%20high%20density%20high%20performance%20phase%20chan-ge%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

METHODS OF OPERATING A BISTABLE RESISTANCE RANDOM ACCESS MEMORY WITH MULTIPLE MEMORY LAYERS AND MULTILEVEL MEMORY STATES

CROSS REFERENCE TO RELATED APPLICATIONS

This application is a continuation of application Ser. No. 12/134,117 filed on 5 Jun. 2008 (now U.S. Pat. No. 7,586,778), which application is a continuation of application Ser. No. 11/552,464 filed on 24 Oct. 2006 (now U.S. Pat. No. 7,388,771), which patents are incorporated herein by reference.

This application relates to, now abandoned, U.S. patent application Ser. No. 11/552,433, filed on 24 Oct. 2006, entitled "Bistable Resistance Random Access Memory Structures with Multiple Memory Layers and Multilevel Memory States" by ChiaHua Ho et al. (US Publication No. 2008/0094885), owned by the assignee of this application and incorporated herein by reference.

BACKGROUND OF THE INVENTION

1. Field of the Invention

The present invention relates to high density memory devices based on programmable resistance memory materials, including metal-oxide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause the transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. As demand for greater memory capacity is sought, a phase change memory that stores multiple bits per memory layer would be highly desirable.

SUMMARY OF THE INVENTION

A bistable resistance random access memory (RRAM) is described that comprises a plurality of programmable resistance random access memory cells where each programmable resistance random access memory cell has multiple memory layer stacks. Each memory layer stack includes a conductive layer overlying a programmable resistance random access memory layer. In a first aspect of the invention, a first memory layer stack overlies a second memory layer stack, and the second memory stack overlies a third memory layer stack. The first memory layer stack includes a first conductive layer overlying a first programmable resistance random access memory layer. The second memory layer stack includes a second conductive layer overlying a second programmable resistance random access memory layer. The third memory layer stack includes a third conductive layer overlying a third programmable resistance random access memory layer. The third programmable resistance random access memory layer has a memory area that is larger than the memory area of the second programmable resistance random access memory layer. The second programmable resistance random access memory layer has a memory area that is larger than the memory area of the first programmable resistance random access memory layer.

Each programmable resistance random access memory layer possesses multilevel memory states, e.g. a first bit for storing a first state and a second bit for storing a second state. The first memory stack is in series with the second memory stack, and the second memory stack is in series with the third memory stack. A memory cell that has three memory stacks provides eight logic states, or 2 k, where k denotes the number of memory layers or the number of memory stacks. The number of memory stacks can be reduced to, for example, two memory stacks per memory cell, or increased to, for example, four memory stacks per memory cell, depending on the memory design.

Suitable materials for the first programmable resistance random access memory layer, the second programmable resistance random access memory layer, or the third programmable resistance random access memory layer include, but are not limited to, a metal oxide, a colossal magnetoresistance (CMR) material, a three-element oxide, a phase-change material and a polymer-based material. The RRAM material for the first programmable resistance random access memory layer can be selected to be the same or different from the RRAM material for the second programmable resistance random access memory layer. The RRAM material for the third programmable resistance random access memory layer can be selected to be the same or different from the RRAM material for the first programmable resistance random access memory layer. The RRAM material for the third programmable resistance random access memory layer can be selected to be the same or different from the RRAM material for the second programmable resistance random access memory layer. The thickness of each RRAM material in the first, second and third programmable resistance random access memory materials ranges from, for example, about 1 nm to about 200 nm.

Broadly stated, a memory device comprises a first conductive member overlying a first programmable resistance random access memory member, the first programmable resistance random access memory member having an area representing a first resistance value, the first conductive member and the first programmable resistance random access memory member having sides; and a second conductive member overlying a second programmable resistance random access memory member, the first programmable resistance random access memory member overlying the second conductive member, the first programmable resistance random access memory member in series with the second programmable resistance random access memory member, the second programmable resistance random access memory member having an area representing a second resistance value, the second programmable resistance random access memory member having the area that is larger than the area of the first programmable resistance random access memory member.

A method for manufacturing a bistable resistance random access memory with multiple memory layer stacks is also described. A first memory layer stack, including a first conductive layer overlying a first programmable resistance random access memory material, is deposited over a second memory layer stack, including a second conductive layer overlying a second programmable resistance random access memory layer. A mask is disposed over a portion of the first conductive layer with dry or wet etching chemistry. The left sides and the right sides of the first conductive layer and the first programmable resistance random access memory layer are etched until reaching a top surface of the second conductive layer, thereby producing a first conductive member and a first programmable resistance random access memory member. A dielectric spacer is deposited on the left sides and right sides of the first conductive member and the first programmable resistance random access memory member.

The thickness of the dielectric spacer affects the size of the area of the second conductive member and the size of the area of the second programmable resistance random access memory member. For example, if the critical dimension (CD) of the mask is about 0.15 µm, the thickness of the dielectric spacer can be selected to be about 31 nm, which means that the area of the second programmable resistance random access memory member is about two times the area of the first programmable resistance random access memory member. An area is inversely proportional to a resistance value, as represented by the mathematical relationship $R=\rho(1/A)$, where 1 denotes the length of a programmable resistance random access memory member and the symbol A denotes the area of the programmable resistance random access memory member. In this instance, the resistance of the second programmable resistance random access memory member is about half of the resistance of the first programmable resistance random access memory member. The desirable resistance difference between the first and second programmable resistance random access memory members depends on the SET/RESET resistance window (which is defined as the resistance ratio of one state to another state) of the programmable resistance random access memory member. The left sides and the right sides of the second conductive layer and the second programmable resistance random access memory layer are etched, thereby producing a second conductive member and a second programmable resistance random access memory member. The left sides and the right sides of the second conductive layer and the second programmable resistance random access memory layer are etched until either reaching an underlying layer or etching through the underlying layer. A via plug is disposed beneath the underlying layer.

In a second aspect of the invention, a method for operating a resistance random access memory having two memory layer stacks that are aligned in series is disclosed. The first memory stack includes a first conductive layer overlying a first programmable resistance random access memory layer, and the second memory stack includes a second conductive layer overlying a second programmable resistance random access memory layer. A first voltage Vb1 is connected to a top surface of the first conductive layer and a second voltage Vb2 is connected to a bottom surface of the second programmable resistance random access memory layer. A first programmable resistance random access voltage V1RRAM has a first terminal connected to the first conductive member and a second terminal connected to the first programmable resistance random access memory member. A second programmable resistance random access voltage V2RRAM has a first terminal commonly connected to the first programmable resistance random access memory member and a second terminal connected to the second programmable resistance random access memory member.

Two significant variables affect how the bistable programmable resistance random access memory changes from one logic state to another logic state. The first variable, denoted by the symbol n, represents the characteristic of a selected memory material. The second variable, denoted by the symbol f, represents the thickness (or width) of a dielectric spacer. The variable f is selected or tuned to fit the resistance variation so that there is an operation window that is sufficiently large to perform a multi-bit RRAM. In a bistable resistance random access memory having two memory layer stacks per memory cell, the bistable resistance random access memory operates in four logic states, a logic "00" state (or a logic "0" state), a logic "01" state (or a logic "1" state), a logic "10" state (or a logic "2" state) and a logic "11" state (or a logic "3" state). The relationship between the four different logic states can be represented mathematically by the two variables n and f and a resistance R. The logic "0" state is represented by a mathematical expression $(1+f)R$. The logic "1" state is represented by a mathematical expression $(n+f)R$. The logic "2" state is represented by a mathematical expression $(1+nf)R$. The logic "3" state is represented by a mathematical expression $n(1+f)R$.

Advantageously, the present invention increases the overall density of a bistable resistance random access memory by employing multiple memory layer stacks for each memory cell. The present invention also provides a three-dimensional solution in the design and manufacturing of the bistable resistance random access memory. The present invention further reduces resistance variations in the bistable resistance random access memory.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
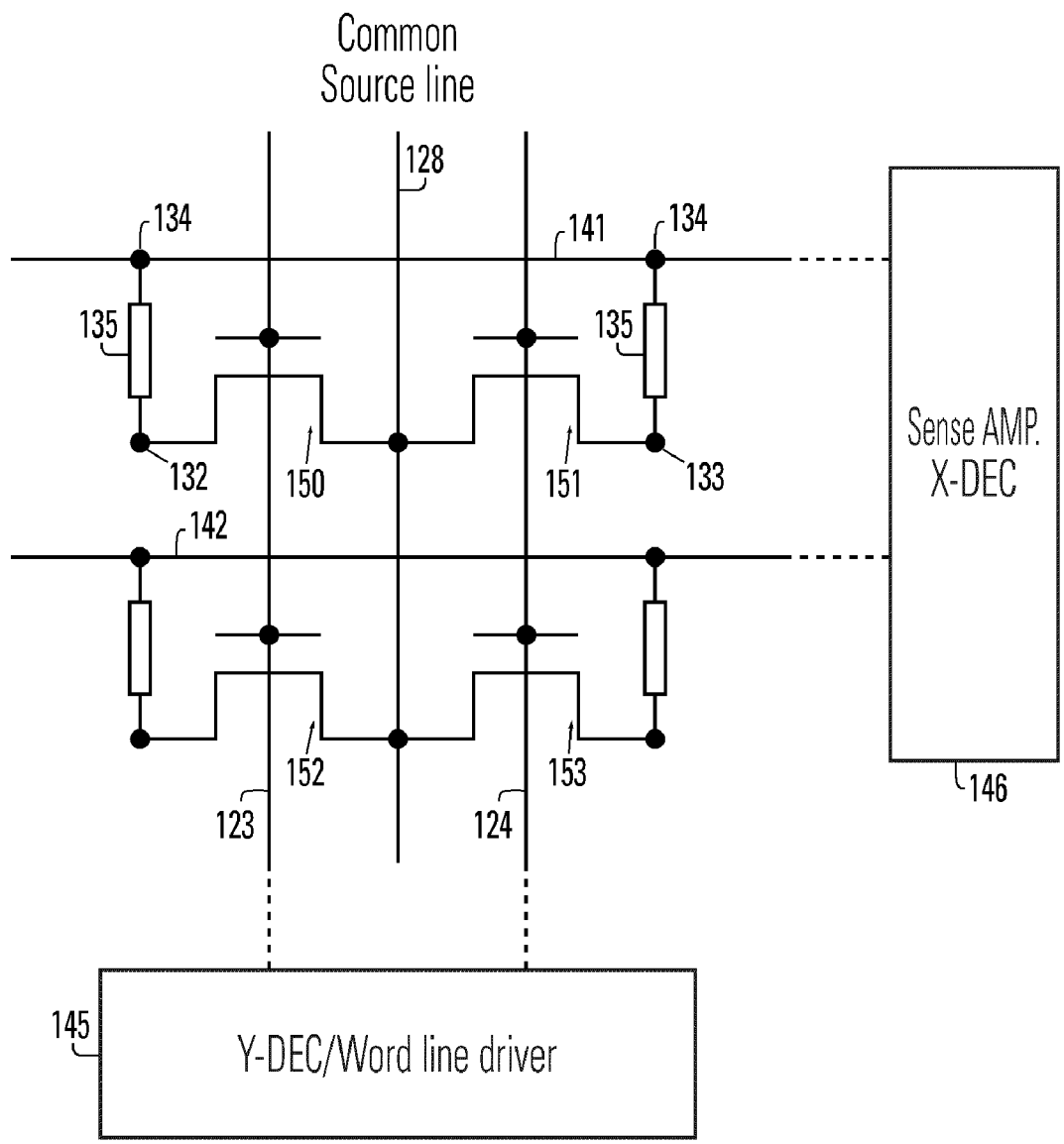
FIG. 1 is a schematic diagram of a bistable resistance random access memory array in accordance with the present invention.

A description of structural embodiments and methods of the present invention is provided with reference to FIGS. 1-17. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for sidewall pin memory cell 135, which has top electrode member 134 and bottom electrode member 132. The top electrode member 134 is coupled to the bit line 141. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
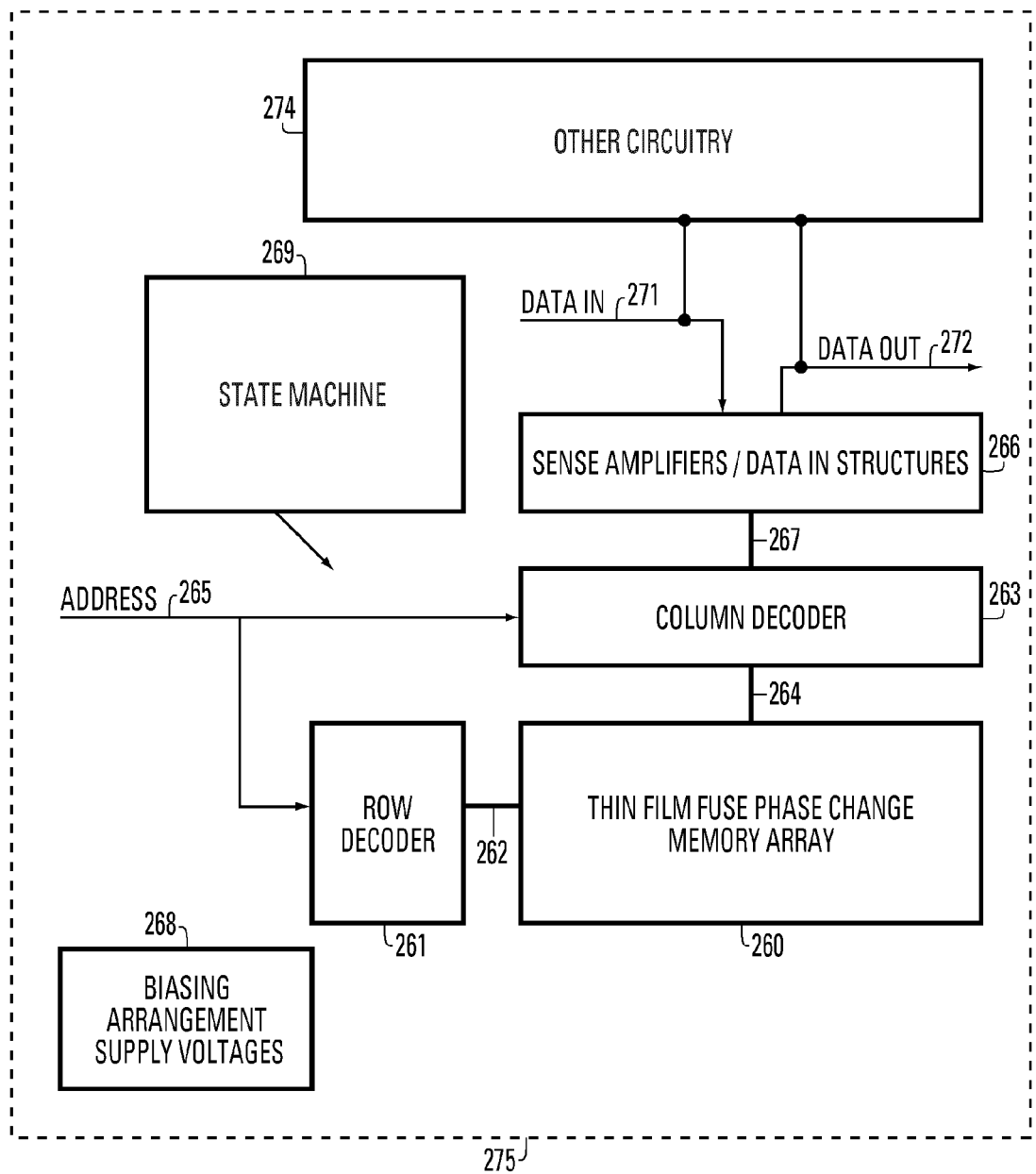
FIG. 2 is a simplified block diagram of an integrated circuit of an RRAM architecture according to an embodiment of the present invention.

FIG. 2 is a simplified block diagram of an integrated circuit 200 of an RRAM architecture according to an embodiment of the present invention. The integrated circuit 275 includes a memory array implemented using sidewall active pin bistable resistance random access memory cells on a semiconductor substrate. A row decoder 261 is coupled to a plurality of word lines 262, and arranged along rows in the memory array 260. A pin decoder 263 is coupled to a plurality of bit lines 264 arranged along pins in the memory array 260 for reading and programming data from the sidewall pin memory cells in the memory array 260. Addresses are supplied on a bus 265 to a pin decoder 263 and a row decoder 261. Sense amplifiers and data-in structures in a block 266 are coupled to the pin decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry is included on the integrated circuit, such as a general-purpose processor or special purpose application circuitry, or a combination of modules providing system-on-a-chip functionality supported by the thin film bistable resistance random access memory cell array. Data is supplied via the data-out line 272 from the sense amplifiers in block 266 to input/output ports on the integrated circuit 275, or to other data destinations internal or external to the integrated circuit 275.

A controller utilized in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
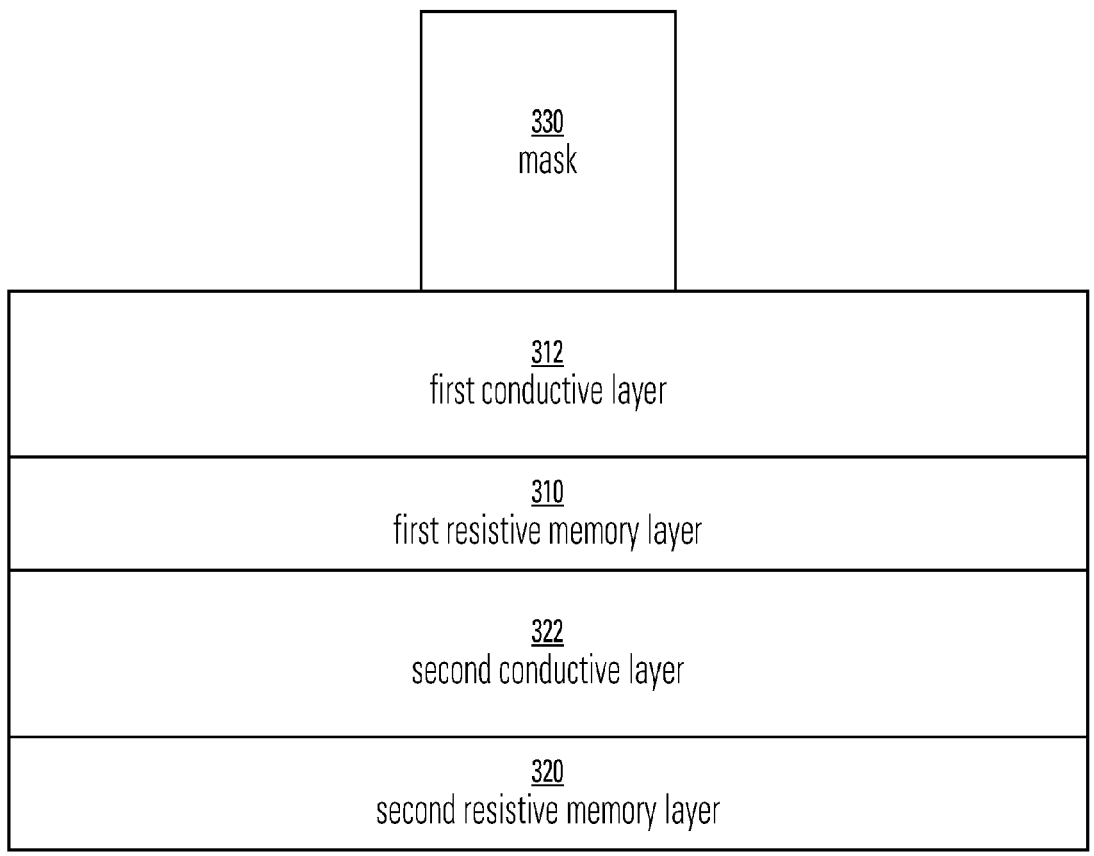
FIG. 3 is a simplified process diagram showing a reference step in the manufacturing of the bistable resistance random access memory with the deposition and lithography of two programmable resistance random access memory layers in accordance with the present invention.

FIG. 3 is a simplified process diagram showing a reference step in the manufacturing of the bistable resistance random access memory with the deposition and lithography of two resistance random access memory layers. The bistable RRAM 300 comprises a first resistance random access memory layer 310 in series with a second resistance random access memory layer 320. Each of the first resistance random access memory layer 310 and the second resistance random access memory layer 320 provides the capability to store two states of information. The first and second resistance random access memory layers 310, 320 in the bistable RRAM 300 provide a total of four logic states, a first logic "00" (or "0") state, a second logic "01" (or "1") state, a third "10" (or "2") state, and a fourth logic "11" (or "3") state.

In one embodiment, the first resistance random access memory layer 310 is made from the same material as the second resistance random access memory layer 320. In another embodiment, the first resistance random access memory layer 310 is made of a different material than the second resistance random access memory layer 320. The first resistance random access memory layer 310 can have the same or a different thickness than the second resistance random access memory layer 320. An exemplary thickness of the first resistance random access memory layer 310 or the second resistance random access memory layer 320 ranges from about 1 nm to about 200 nm.

Each of the resistive memory layers 310, 320 is formed from a material that includes at least two stable resistance levels, referred to as resistance random access memory material. Several materials have proved useful in fabricating RRAM, as described below.

The term "bistable RRAM" refers to the control of a resistance level by one of the follow means: a voltage amplitude, a current amplitude or the electrical polarity. The state controlling of a phase-change memory is conducted by the voltage amplitude, the current amplitude, or the pulse time. The electrical polarity of the bistable RRAM 300 does not affect the programming of the bistable RRAM 300.

The following are short summaries describing four types of resistive memory material suitable for implementing an RRAM. A first type of memory material suitable for use in embodiments is colossal magnetoresistance ("CMR") material, such as $Pr_xCa_yMnO_3$ where x:y=0.5:0.5, or other compositions with x:0~1; y:0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post-deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an annealing time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A second type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x:0~1; y:0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A third type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Tai-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an annealing time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

A fourth type is chalcogenide material, such as $Ge_xSb_yTe_z$, where x:y:z=2:2:5, or other compositions with x:0~5; y:0~5; z:0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually performed at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an annealing time of less than 30 minutes. The thickness of chalcogenide material depends on the design of the cell structure. In general, a chalcogenide material with thickness of higher than 8 nm can have a phase change characterization so that the material exhibits at least two stable resistance states.

Embodiments of the memory cell in the bistable RRAM 300 may include phase change based memory materials, including chalcogenide based materials and other materials, for the first resistance random access memory layer 310 and the second resistance random access memory layer 320. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 patent at columns 11-13, which examples are hereby incorporated by reference.

Phase change alloys can be switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, $ZrO_x$, $WO_x$, $TiO_x$, $AlO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

A first conductive layer 312 overlies the first resistance random access memory layer 310 and serves as a conductive element. A second conductive layer 322 is disposed between the first resistance random access memory layer 310 and the second resistance random access memory layer 320. The first conductive layer 312 serves as a conductive element associated with the first resistance random access memory layer 310. The second conductive layer 322 serves as a conductive element associated with the second resistance random access memory layer 320. Suitable materials for the first conductive layer 312 and the second conductive layer 322 include Ti, TiN, TiN/W/TiN, TiN/Ti/Al/TiN, n+ polysilicon, TiON, Ta, TaN, TaON and others.

In one embodiment, the first conductive layer 312 has the same material as the second conductive layer 322. In another embodiment, the first conductive layer 312 has a different material than the second conductive layer 322. The first conductive layer 312 can have the same or a different thickness than the second conductive layer 322. An exemplary thickness of the first conductive layer 312 or the second conductive layer 322 ranges from about 10 nm to about 200 nm.

A mask 330 is formed over the first conductive layer 312. The mask 330 includes a photoresist or a hard mask, such as $SiO_x$, $SiN_x$, $SiO_xN_y$. The critical dimension of the mask 330 can be trimmed by selecting a technique that is suitable for the type of mask. If the mask 330 is a photoresist, a reactive ion etcher with $Cl_2$ or HBr based chemistries can be used to trim the photoresist. If the mask 330 is a hard mask, wet trimming with a suitable solvent can be used to trim the hard mask. In particular, a dilute HF (DHF) can be used on a hard mask that is made of $SiO_x$. Hot phosphoric acid (HPA) can be used on a hard mask that is made of $SiN_x$.

Figure 4:
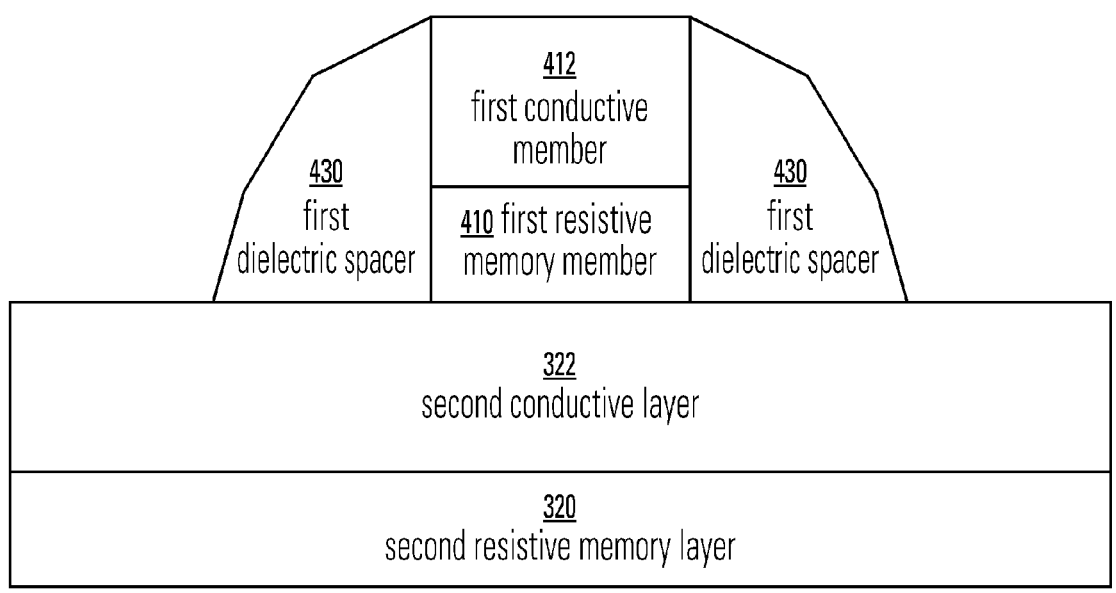
FIG. 4 is a process diagram showing a next step in the manufacturing of the bistable resistance random access memory that carries out an etch process until reaching the second conductive layer with the deposition of a dielectric spacer adjacent to a first conductive member and a first resistance random access memory member in accordance with the present invention.
Figure 5:
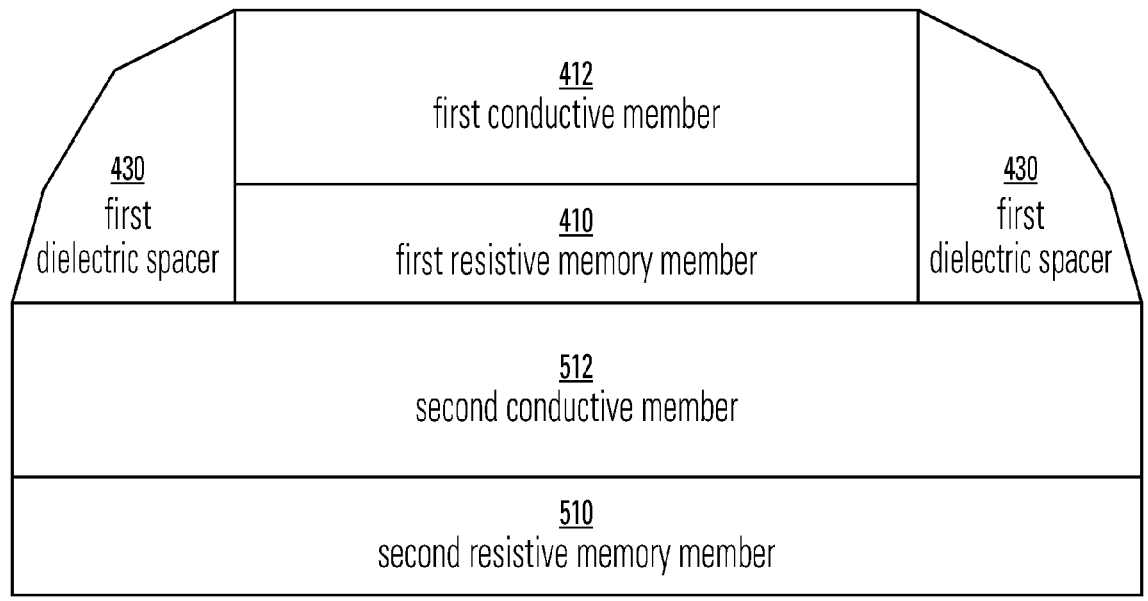
FIG. 5 is a process diagram showing a next step in the manufacturing of the bistable resistance random access memory that etches through the second resistance random access memory layer in accordance with the present invention.

FIG. 4 is a process diagram showing a next step in the manufacturing of the bistable resistance random access memory 300 that carries out an etch process until reaching the second conductive layer 322 with the deposition of a dielectric spacer adjacent to a first conductive member 412 and a first resistance random access memory member 410. The first conductive layer 312 and the first resistance random access memory layer 310, as shown in FIG. 3, are etched until reaching the top surface of the second conductive layer 322 to produce the first conductive member 412 and the first resistance random access memory material 410. The etch process may be a single anisotropic etch for both the first conductive layer 312 and the first resistance random access memory layer 310, or a two step process first etching the first conductive layer 312 with a first etch chemistry, and second etching the first resistance random access memory layer 310 with a second etch chemistry. Etching chemistries are selected in dependence on the material or materials selected. For example, if TiN is used as the first conductive member 412 and $WO_x$ is used as the first resistance random access memory material 410, the two step etching process is carried out with first etching with $Cl_2$ of the first conductive layer 312 and second etching with $SF_6$ of first resistance random access memory layer 310. A dielectric spacer 430 is deposited around the left sides and the right sides of the first resistance random access memory material 410 and the first conductive member 412. The dielectric spacer overlies a portion of the top surface of the second conductive layer 322. Suitable materials for the dielectric spacer 430 include $SiO_x$ and $SiN_x$ where the selected material has a predetermined thickness. The thickness of the dielectric spacer 430 affects the area of the second conductive member 512 (as shown in FIG. 5) and the second programmable resistance random access memory member 510 (as shown in FIG. 5). For example, if the mask 330 has a critical dimension of about 0.15 μm, the predetermined thickness can be about 31 nm so that the area of the second resistance random access memory member 510 is about 2 times that of the first resistance random access memory member 410. In other words, for the same logic state, e.g. for SET or RESET state, the resistance of the second resistance random access memory member 510 is about half of the resistance of the first resistance random access memory member 410. The resistance differential between the first resistance random access memory member 410 and the second resistance random access member 510 depends on the SET/RESET resistance window of a resistance random access memory material. If the SET/RESET window is about 10 times (1 order of magnitude), the resistance differential of about 2 times between the first resistance random access memory member 410 and the second resistance random access memory member 510 is suitable.

Figure 6:
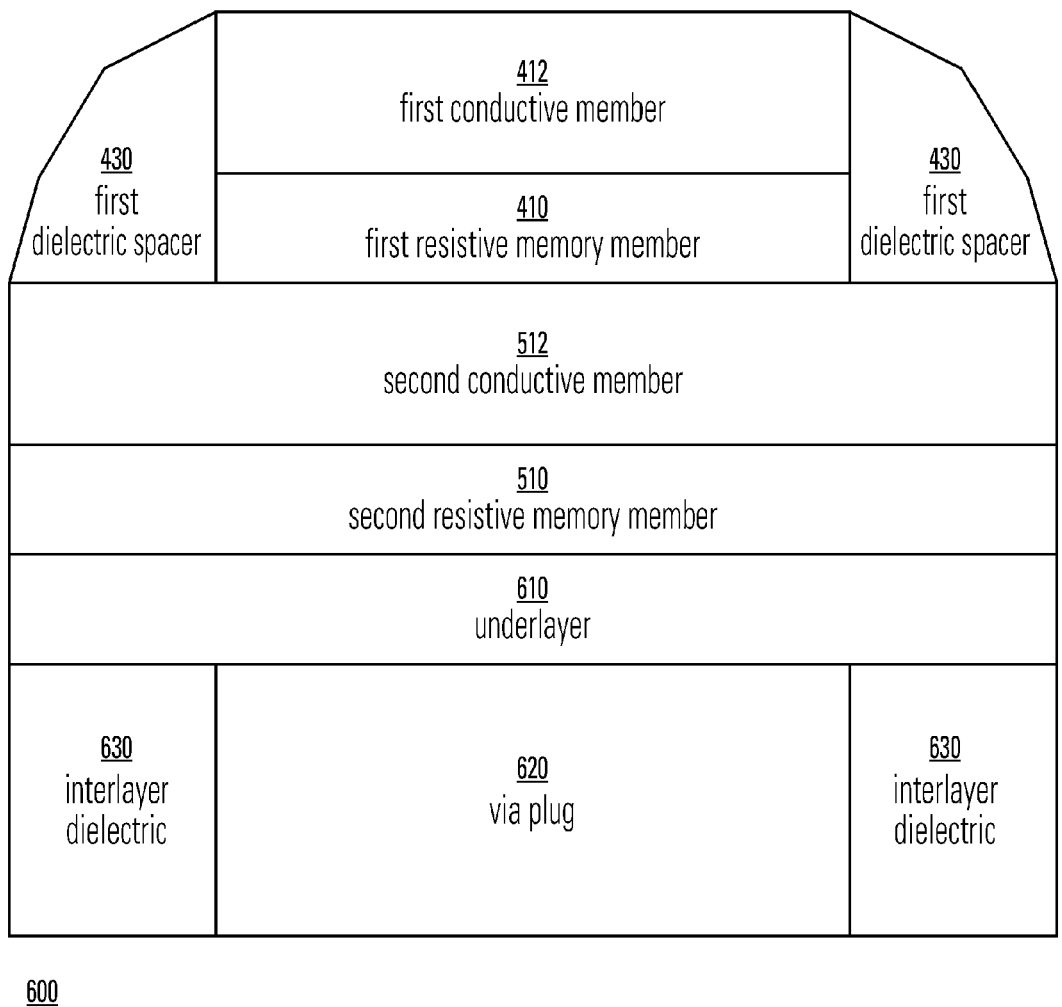
FIG. 6 is a simplified process diagram showing a resistance random access memory cell structure of the bitable resistance random access memory in accordance with the present invention.

FIG. 5 is a process diagram 500 showing a next step in the manufacturing of the bitable resistance random access memory that etches through the second resistance random access memory material. The second conductive layer 322 and the second resistance random access memory layer 320, as shown in FIG. 3, are etched until reaching the top surface of an underlayer, or are etched through an underlayer 610, as shown in FIG. 6, by a reactive ion etcher, to produce the second conductive member 512 and the second resistance random access memory member 510. The etch process may be a single anisotropic etch for both the second conductive layer 322 and the second resistance random access memory layer 320, or a two step process first etching the second conductive layer 322 with a first etch chemistry, and second etching the second resistance random access memory layer 320 with a second etch chemistry. Etching chemistries are selected in dependence on the material or materials selected. For example, if TiN is used for the second conductive member 512 and if $WO_x$ is used as the second resistance random access memory member 510, the two step etching process is carried out with first etching with $Cl_2$ of the second conductive member 512 and second etching with $SF_6$ of second resistance random access memory material 510.

FIG. 6 is a simplified process diagram showing a resistance random access memory cell structure 600 of the bitable resistance random access memory. The cell structure 600 illustrates that the underlayer 610 has been etched through, as described above with respect to FIG. 5. The cell structure 600 of the bistable resistance random access memory comprises the underlayer 610 underlying the second resistance random access memory member 510. The etch process of the underlayer 610 stops on the top surface of the interlayer dielectric 630. The underlayer 610 connects to a via plug 620 that is disposed beneath the underlayer 610 with interlayer dielectric 630 surrounding the via plug 620. Embodiments of the via plug 620 include a W-plug, or a poly-Si plug. The poly-Si plug can be constructed with poly-Si diode or NP diode.

Figure 7:
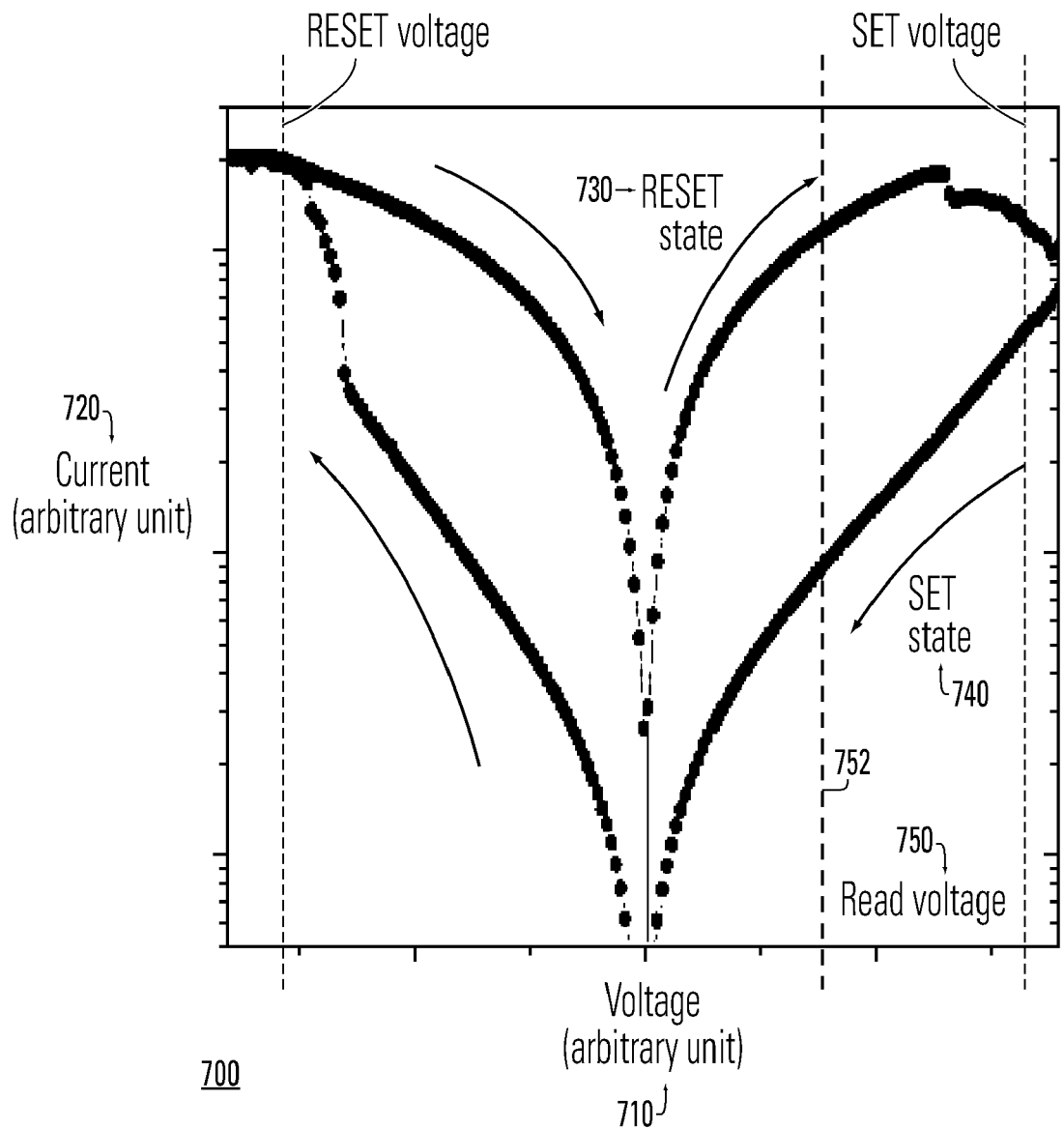
FIG. 7 is a graph showing an exemplary I-V curve in a bistable resistance random access memory with one resistance random access memory layer in accordance with the present invention.

FIG. 7 is a graph 700 showing an exemplary I-V curve in a bistable resistance random access memory with one resistance random access memory layer with the x-axis representing voltage 710 and the y-axis representing current 720. In a RESET state 730, the resistance random access memory layer is in low resistance. In a SET state 740, the resistance random access memory layer is in high resistance. In this example, the SET/RESET window of the resistance random access memory layer is about one order of magnitude of a read voltage 750. The read voltage 750, illustrated with a dotted line 752, shows that there is a significant gap between a high current state (or high logic state) and a low current state (or a low logic state). From the RESET state 730, after a voltage stress, the current in the RESET state 730 swings upward to high current. From the SET state 740, the current in the SET state 740 swings downward. The large swing in the current drop from a low state to a high state, or from a high state to a low state makes it difficult to realize different logic multilevel states with a voltage controller. Instead, different resistance random access memory layers are connected in series, where each resistance random access memory layer has its own area or own resistance, for use in realizing the different logic states in a bistable resistance random access memory.

Figure 8A:
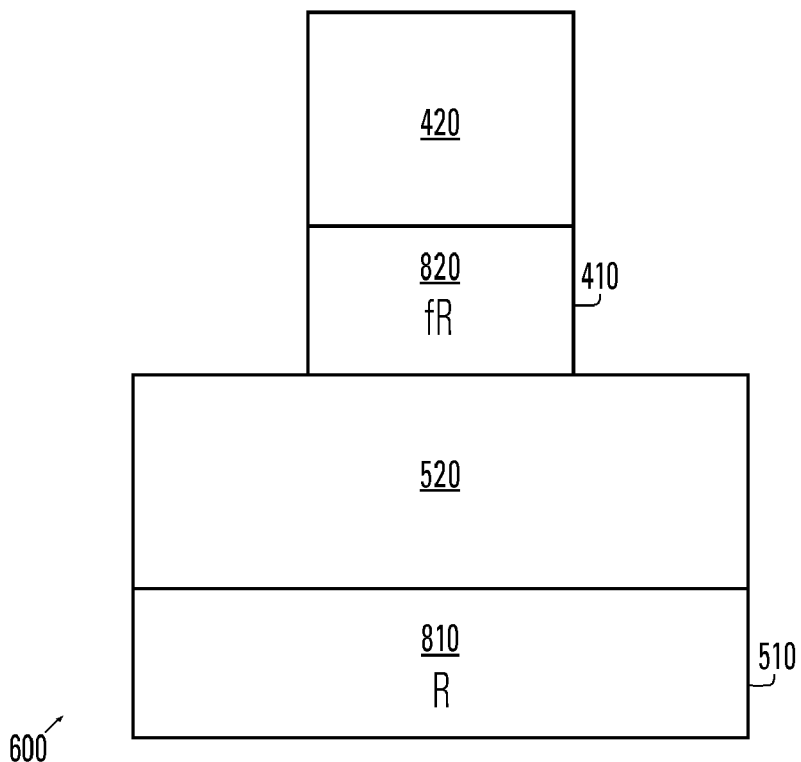
FIG. 8A is a simplified process diagram of the bistable resistance random access memory with two resistance random access memory members both in RESET states in accordance with the present invention.

FIG. 8A illustrates a simplified process diagram of the bistable resistance random access memory 600 with two resistance random access memory layers both in RESET states. The bistable resistance random access memory 600 operates in a logic "00" state when both the first resistance random access memory member 410 and the second resistance random access memory member 510 are in RESET states. The second resistance random access memory member 510 has a resistance R 810 and the first resistance random access memory member 410 has a resistance of fR 820, where the variable f is greater than 1 because the area of the first resistance random access memory member 410 is less than the area of the second resistance random access memory member 510. The total resistance of the bistable random access memory 600 is about (1+f)R. For example, if the variable f is equal to 2, the total resistance would be computed as 3 R, represented mathematically as (1+2)R=3 R.

Figure 8B:
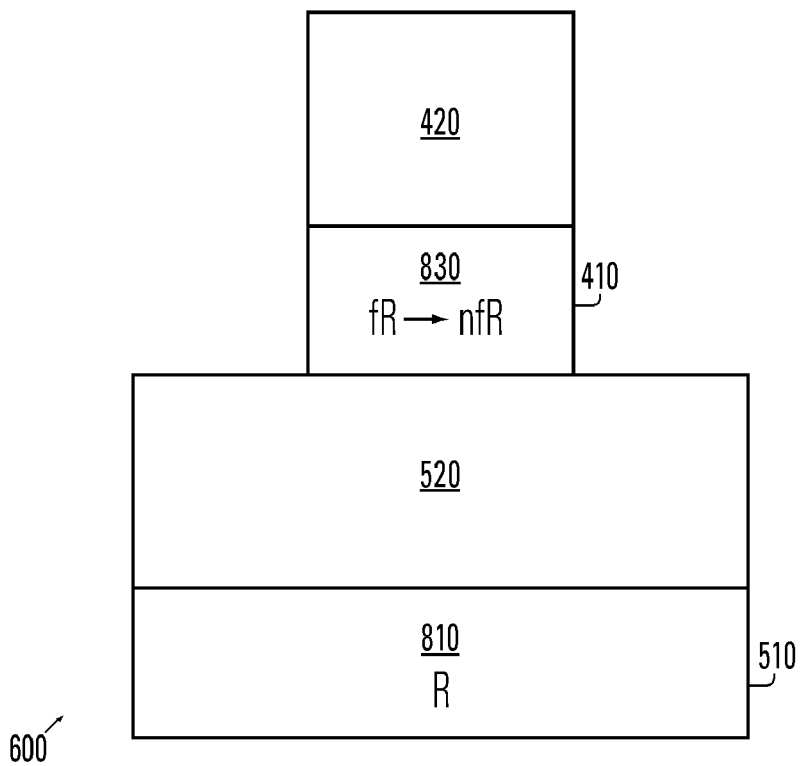
FIG. 8B is a simplified process diagram of the bistable resistance random access memory with the two resistance random access members in SET and RESET states in accordance with the present invention.

FIG. 8B is a simplified process diagram of the bistable resistance random access memory 600 with the two resistance random access memory layers in SET and RESET states. The bistable resistance random access memory 600 operates in a logic "01" state when the first resistance random access memory member 410 is in a SET state and the second resistance random access memory member 510 is in a RESET state, where the second resistance random access memory member 510 remains in the RESET state or unchanged. The second resistance random access memory member 510 has a resistance R 810 and the first resistance random access memory member 410 has a resistance of nfR 830, where the variable n can be greater than 1. The total resistance of the bistable random access memory 600 is about (1+nf)R. For example, if the variable f is equal to 2 and the variable n is equal to 10, the total resistance would be computed as 21 R, represented mathematically as (10+21)R=31 R.

Figure 8C:
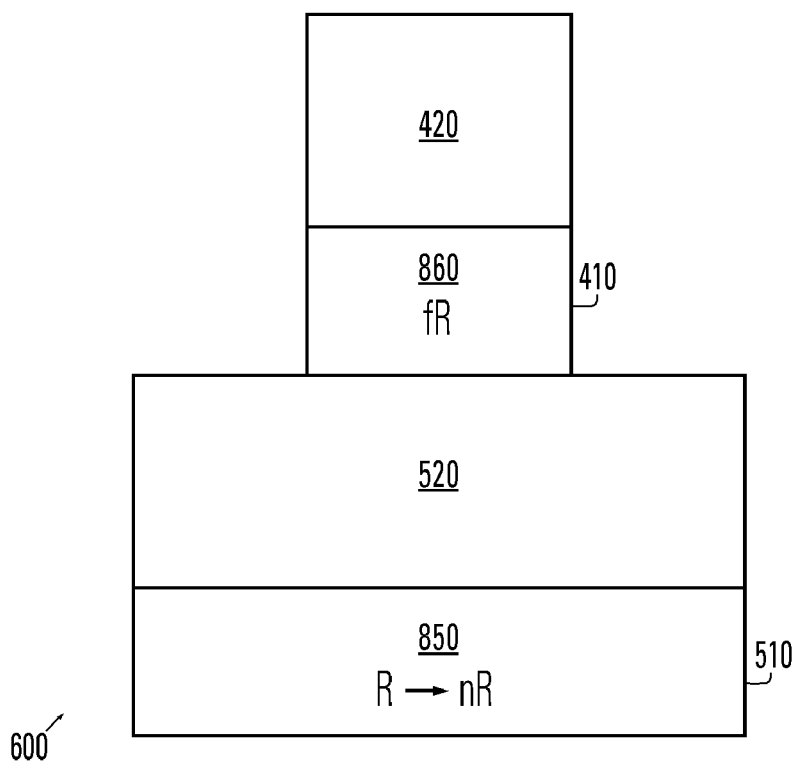
FIG. 8C is a simplified process diagram of the bistable resistance random access memory with the two resistance random access memory members in SET and RESET states in accordance with the present invention.

FIG. 8C is a simplified process diagram of the bistable resistance random access memory 600 with the two resistance random access memory layers in SET and RESET states. The bistable resistance random access memory 600 operates in a logic "10" state when the first resistance random access memory material member 410 is in a RESET state and the second resistance random access memory member 510 is in a SET state, where the first resistance random access memory member 410 remains in the RESET state or unchanged. The second resistance random access memory member 510 has a resistance nR 850 and the first resistance random access memory member 410 has a resistance of fR 860, where the variable n can be greater than 1. The total resistance of the bistable random access memory 600 is about (n+f)R. For example, if the variable f is equal to 2 and the variable n is equal to 10, the total resistance would be computed as 12 R, represented mathematically as (10+2)R=12 R.

Figure 8D:
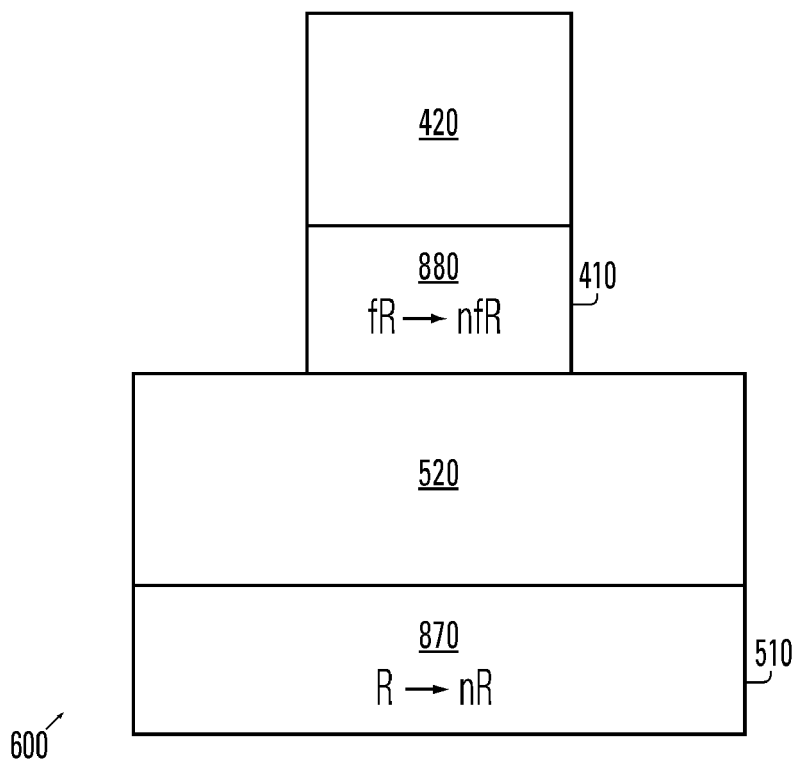
FIG. 8D is a simplified process diagram of the bistable resistance random access memory with the two resistance random access memory members in SET states in accordance with the present invention.

FIG. 8D is a simplified process diagram of the bistable resistance random access memory 600 with the two resistance random access memory layers both in SET states. The bistable resistance random access memory 600 operates in a logic "11" state when the first resistance random access memory member 410 is in a SET state and the second resistance random access memory member 510 is in a SET state. The second resistance random access memory member 510 has a resistance nR 870 (FIG. 8D represents a wrong number: the resistance of the second resistance random access memory member 510 should be nR, not nfR. Please change it.) and the first resistance random access memory member 410 has a resistance of nfR 880. The total resistance of the bistable random access memory 600 is about n(1+f)R. For example, if the variable f is equal to 2 and the variable n is equal to 10, the total resistance would be computed as 30 R, represented mathematically as 10(1+2)R=30 R.

Figure 9:
FIG. 9 illustrates mathematical relationships for the four logic states in the bistable resistance random access memory that have two resistance random access memory members in series to provide four logic states in accordance with the present invention.
Figure 9:
Figure 9:
Figure 9:

FIG. 9 illustrates mathematical relationships for the four logic states in the bistable resistance random access memory 600 having two resistance random access memory members in series to provide four logic states, and two bits per memory cell. Three variables R, n, and f are used in formulating the resistance relationship, where the variable R represents the RESET resistance of one memory member, the variable n is associated with the character of a resistance random access memory material, and the variable f is associated with the thickness of a dielectric spacer. In other words, the variable n depends on the properties associated with a selected material. The variables can be controlled by dielectric spacer thickness. In the logic state "0" 910, the total resistance of the bistable resistance random access memory 600 is about (1+f)R. In the logic state "1" 920, the total resistance of the bistable resistance random access memory 600 is about (n+f)R. In the logic state "2" 930, the total resistance the bistable resistance random access memory 600 is about (1+nf)R. In the logic state "3" 940, the total resistance of the bistable resistance random access memory 600 is about n(1+f)R. The variable f is tuned to fit with the resistance variation so that there is an operation window sufficient for a 2-bit operation in the bistable resistance random access memory 600. For example, the 2-bit operation windows described above show the following resistance: 3 R, 12 R, 21 R to 30 R. If the variable n=100, and the variable f=2, the 2-bit operation window would be computed to be 3 R, 102 R, 201 R and 300 R.

Figure 10:
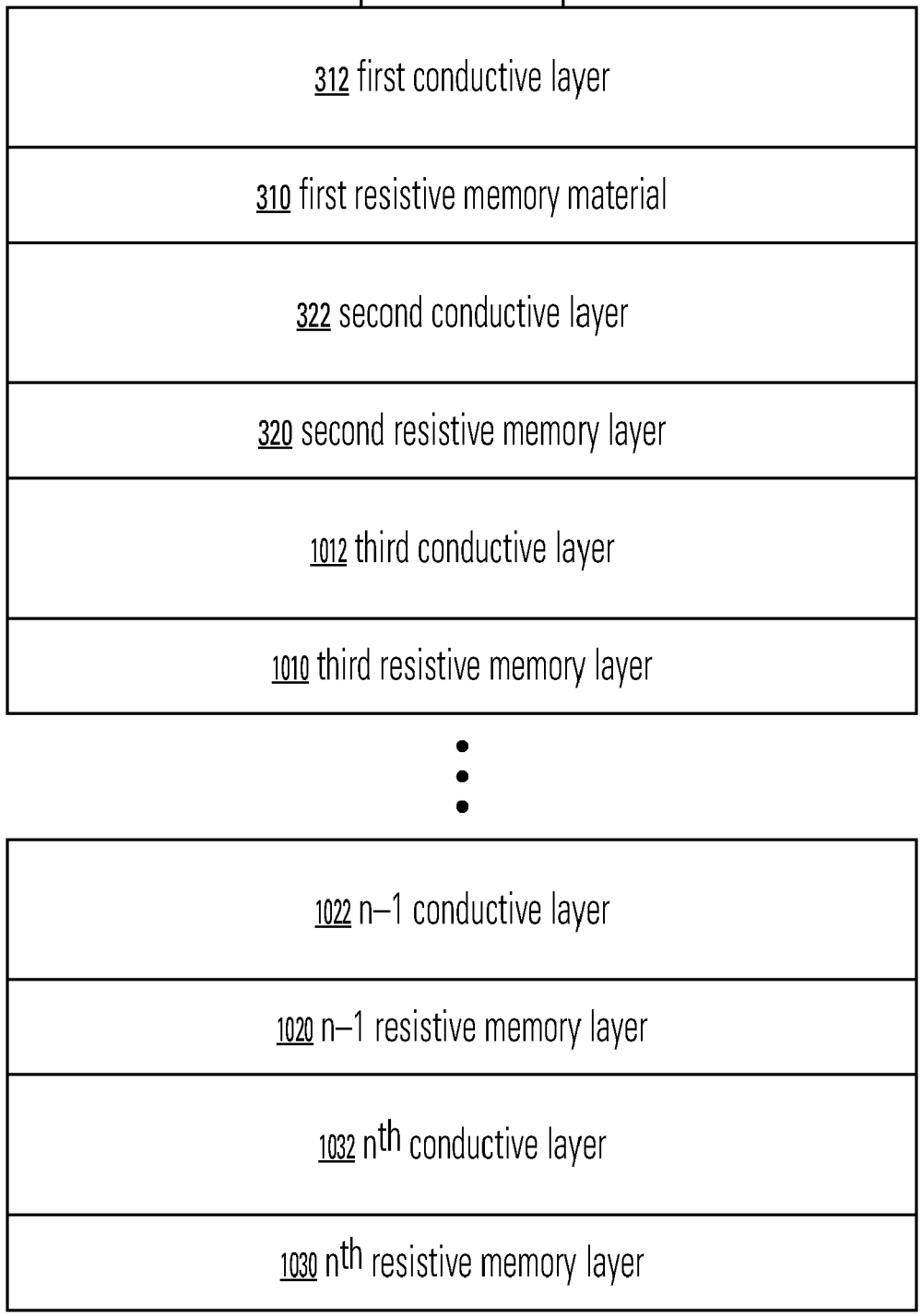
FIG. 10 is a process diagram of the bistable resistance random access memory with multiple resistance random access memory members in series to provide multiple bits per memory cell in accordance with the present invention.

FIG. 10 is a process diagram of a bistable resistance random access memory 1000 with multiple memory layers. Multiple resistance random access memory members are in series to provide multiple bits per memory cell. The bistable RRAM 1000 comprises multiple resistance random access memory layers that are in series, i.e. a first resistance random access memory layer 310 is in series with a second resistance random access memory layer 320, the second resistance random access memory layer 320 is in series with a third resistance random access memory layer 1010, . . . , an $(n-1)^{th}$ resistance random access memory layer 1020 is in series with an $n^{th}$ resistance random access memory layer 1030. In one embodiment, each of the first, second, third . . . $(n-1)^{th}$, $n^{th}$ resistance random access memory layers 310, 320, 1010, 1020, 1030 provides the capability to store two logic states. In additional embodiments, each of the first, second, third . . . $(n-1)^{th}$, $n^{th}$ resistance random access memory layers 310, 320, 1010, 1020, 1030 provides the capability to store more than two bits of information. In other embodiments, each of the first, second, third . . . $(n-1)^{th}$, $n^{th}$ resistance random access memory layers 310, 320, 1010, 1020, 1030 provides the capability to store two or more two bits of information where each bit is capable of storing multiple levels of information. The total number of logic states in the bistable RRAM 1000 is determined by the x number of bits per resistance random access memory layer and y number of levels per bit, represented mathematically as $Z^{x*y}$, where the symbol Z represents the total number of resistance random access memory layers. For example, if the bistable RRAM 1000 has eight resistance random access memory layers, where each resistance random access memory layer stores 1 bit of information and where each bit stores two logic states or current levels, the total number of logic states would be computed as $8^{1*2}$ or 64 logic states.

The first, second, third . . . $(n-1)^{th}$, $n^{th}$ resistance random access memory layers 310, 320, 1010, 1020, 1030 can have the same or different material from each other, or some combination of the same material for certain resistance random access memory layers and another material for other resistance random access memory layers. In addition, the first, second, third . . . $(n-1)^{th}$, $n^{th}$ resistance random access memory layers 310, 320, 1010, 1020, 1030 can have the same or different thickness from each other, or some combination of the same thickness for certain resistance random access memory layers and another thickness for other resistance random access memory layers. An exemplary thickness of the first, second, third . . . $(n-1)^{th}$, $n^{th}$ resistance random access memory layers 310, 320, 1010, 1020, 1030 ranges from about 1 nm to about 200 nm.

Each of the resistance random access memory layer is associated with a conductive layer. In addition to the first and second conductive layers 312, 322 described above, a third conductive layer 1012 overlies the third resistance random access memory layer 1010. An $(n-1)^{th}$ conductive layer 1022 overlies the $(n-1)^{th}$ resistance random access memory layer 1020. An $n^{th}$ conductive layer 1032 overlies the $n^{th}$ resistance random access memory layer 1030.

Figure 11:
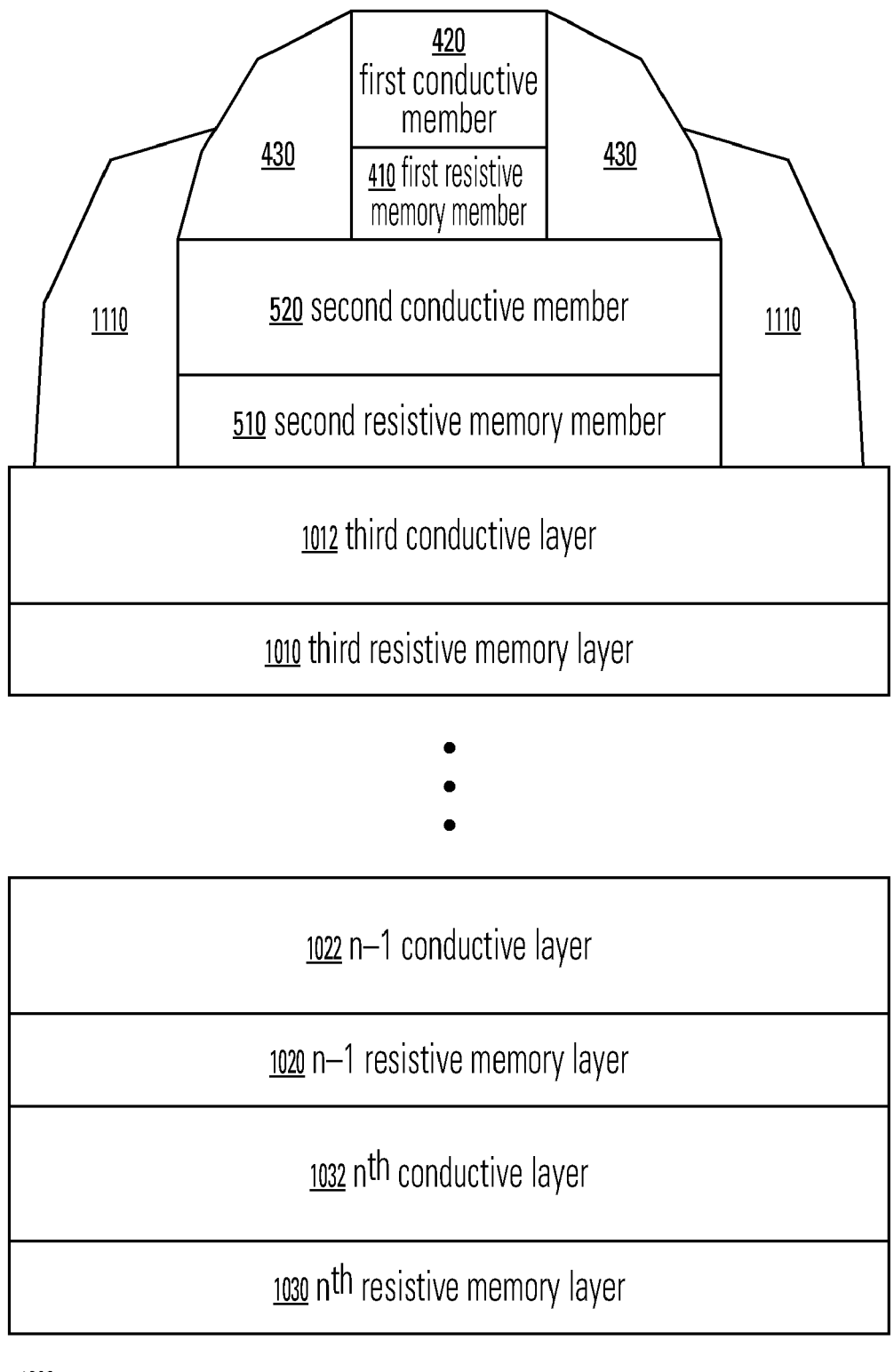
FIG. 11 is a process diagram of the bistable resistance random access memory with an etching process of the first and second resistance random access memory layers and the deposition of dielectric spacers in accordance with the present invention.

FIG. 11 is a process diagram of the bistable resistance random access memory 1000 with an etching process of the first and second resistance random access memory layers 410, 510 and deposition of dielectric spacers 430, 1110. The etching process can be further carried out for subsequent resistance random access memory layers beyond the first and second resistance random access memory members 410, 510, such as the third resistance random access memory layer 1010. In such an instance, the third conductive layer 1012 is also etched during the etching of the third resistance random access memory layer 1010. A corresponding dielectric spacer can also be deposited in a subsequent conductive layer and resistance random access memory layer. In one embodiment, the area of the second resistance random access memory member 510 is determined primarily by the thickness of the first dielectric spacer 430. Similarly, the area of the third resistance random access memory member 1010 is determined primarily by the thickness of the second dielectric spacer 1110. Therefore, each resistance random access memory layer has its individual area that is primarily defined by the dielectric spacer thickness such that each resistance random access memory layer has its own individual resistance.

Figure 12:
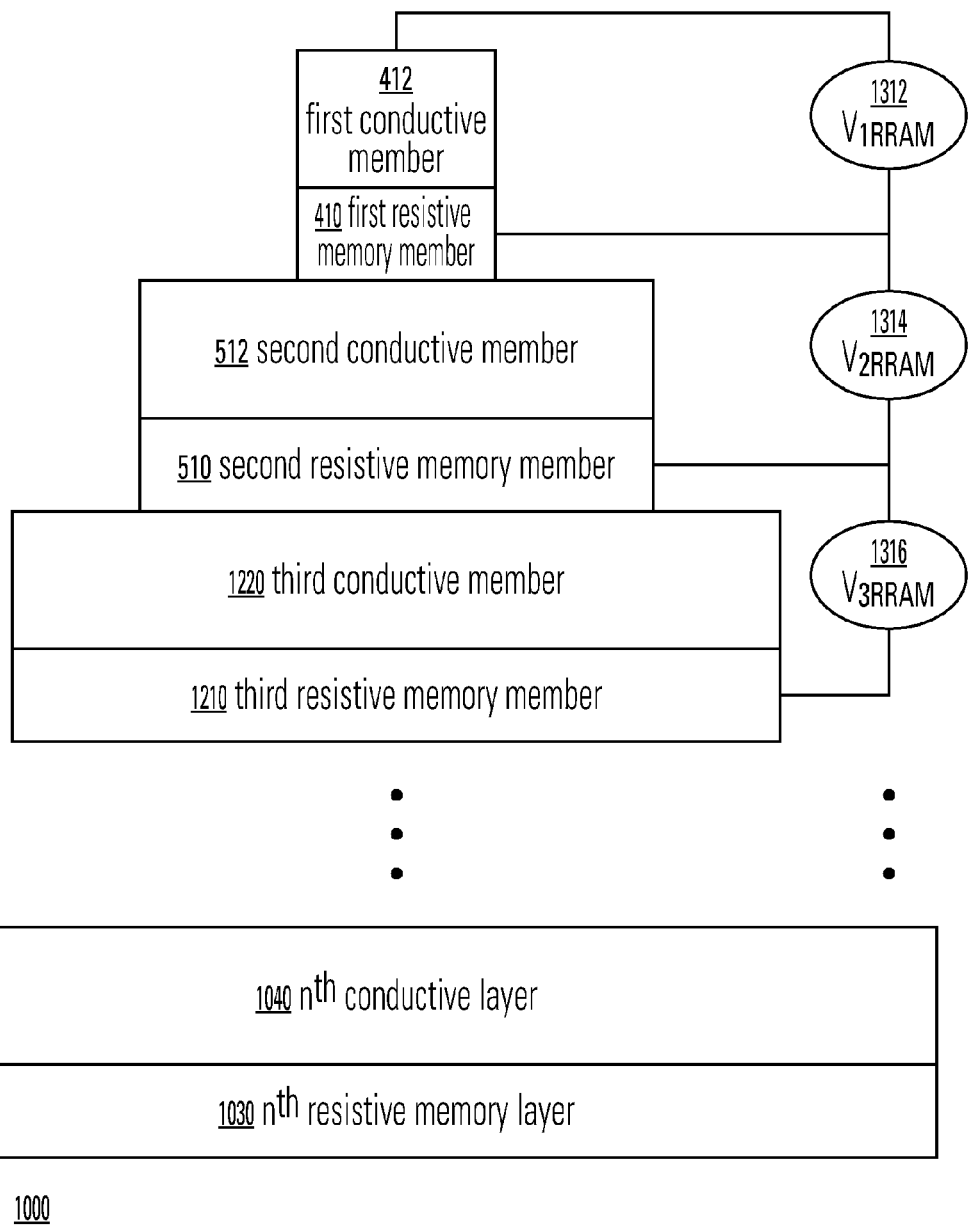
FIG. 12 is a process diagram of the bistable resistance random access memory with multiple resistance random access memory members and multiple conductive members after the removal of dielectric spacers in accordance with the present invention.

FIG. 12 is a process diagram of the bistable resistance random access memory 1000 with multiple resistance random access memory members and multiple conductive members after removal of dielectric spacers. The bistable resistance random access memory 1000 comprises the first conductive member 412 overlying the first resistance random access memory member 410, the first resistance random access memory member 410 overlying the second conductive member 512, the second conductive member 512 overlying the second resistance random access memory member 510, the second resistance random access memory member 510 overlying a third conductive member 1220, the third conductive member 1220 overlying a third resistance random access memory member 1210 . . . and the $n^{th}$ conductive member 1040 overlying the $n^{th}$ resistance random access memory member 1030. In one embodiment, the first conductive member 412 and the first resistance random access memory member 410 have the same width, which is less than the width of the second conductive member 512 and the second resistance random access memory member 510. The second conductive member 512 and the second resistance random access memory member 510 have the same width, which is less than the width of the third conductive member 1220 and the third resistance random access memory member 1210. The $n^{th}$ conductive member 1040 and the $n^{th}$ resistance random access memory member 1030 typically have a wider width than resistance random access memory members and conductive members that are above.

Figure 13:
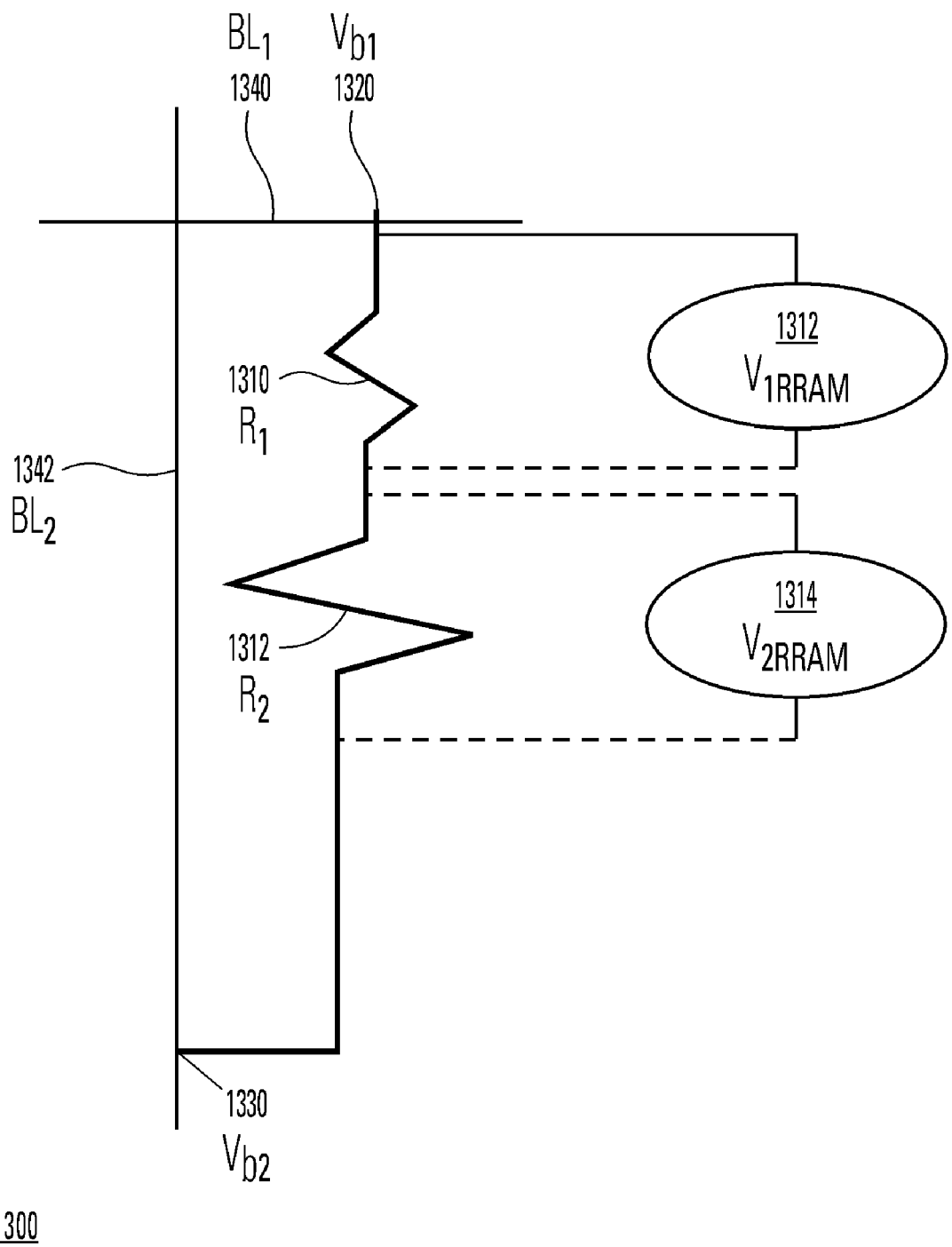
FIG. 13 is a circuit diagram for applying voltages to program the bistable resistance random access memory with two resistance random access memory members in accordance with the present invention.

As illustrated in FIGS. 12 and 13, bit line voltages are applied to the bistable resistance random access memory 600 to reach different logic states. The structure 500 of FIG. 5 can be represented schematically by the equivalent circuit of FIG. 13. In this example, two resistance random access memory layers are described, and additional memory layers and corresponding bit line voltages may be added. The circuit 1300 has a first resistor $R_1$ 1310 representing the resistance of the first programmable resistance random access memory member 410, and a second resistor $R_2$ 1312 representing the resistance of the second programmable resistance random access memory member 510, connected between a first bit line voltage $V_{b1}$ 1320 that is associated with a first bit line $BL_1$ 1340 and a second bit line voltage $V_{b2}$ 1330 that is associated with a second bit line $BL_2$ 1342. The first bit line voltage $V_{b1}$ 1320 is connected to a top surface of the first conductive member 412 and the second bit line voltage $V_{b2}$ 1330 is connected to the bottom surface of the second programmable resistance random access memory member 510. In this embodiment, the bistable resistance random access memory 500 comprises two resistance random access memory layers, which have two voltages associated with the first resistance random access member 410 and the second resistance random access member 510, represented by the symbol $V_{1RRAM}$ 1312 as a first voltage associated with the first resistance random access member 410 and the symbol $V_{2RRAM}$ 1314 as a second voltage associated with the second resistance random access member 510. The first programmable resistance random access voltage $V_{1RRAM}$ 1312 has a first terminal connected to the first conductive member 412 and a second terminal connected to the first programmable resistance random access memory member 410. The second programmable resistance random access memory voltage $V_{2RRAM}$ 1314 has a first terminal commonly connected to the first programmable resistance random access memory member 410 and the first programmable resistance random access voltage $V_{1RRAM}$ 1312, and a second terminal connected to the second programmable resistance random access memory member 510. Additional programmable resistance random access memory voltages, such as $V_{3RRAM}$ 1316 associated with the third resistance random access memory layer 1210, are applicable for subsequent programmable resistance random access memory members.

When the bistable resistance random access memory 500 is reset, i.e. a RESET state, the bistable resistance random access memory 600 starts at the logic "0" state (or "00" state). The bistable resistance random access memory 600 can be programmed from the logic "0" state to the logic "1" state (or "01" state), or from the logic "0" state to the logic "2" state (or "10" state), or from the logic "0" state to the logic "3" state (or "11" state).

In programming the bistable resistance random access memory 500 from the logic "00" state to the logic "10" state, a first voltage is applied on a first bit line to the first bit line voltage $V_{b1}$ 1320 and a second voltage is applied on a second bit line to the second bit line voltage $V_{b2}$ 1330. The voltage applied to the first bit line voltage $V_{b1}$ 1320 can be either zero volts, or a small negative voltage. The voltage difference between the first bit line voltage $V_{b1}$ 1320 and the second bit line voltage $V_{b2}$ 1330 is equal to the sum of the first resistance random access member voltage $V_{1RRAM}$ 1312 and the second resistance random access member voltage $V_{2RRAM}$ 1314, represented mathematically as follows: $V_{b2}-V_{b1}=V_{2RRAM}+V_{1RRAM}=V_{low}$. The initial state for both the first resistance random access member 410 and the second resistance random access member 510 is a RESET state, i.e, a low resistance state. In this embodiment, the first resistance random access member 410 has a smaller area than the second resistance random access member 510. Therefore, the first resistance random access member 410 has a higher resistance than the second resistance random access member 510. This in turn means that the first resistance random access memory voltage $V_{1RRAM}$ 1312 is a value that is greater than the second resistance random access memory voltage $V_{2RRAM}$ 1314, represented in mathematical relationship as $V_{1RRAM}>V_{2RRAM}$. If the first resistance random access memory voltage $V_{1RRAM}$ 1312 is greater than a set voltage ($V_{1RRAM}>V_{SET}$), the first resistance random access memory member 410 changes from a RESET state to a SET state (i.e., high resistance). If the second resistance random access memory voltage $V_{2RRAM}$ 1314 is less than a set voltage ($V_{2RRAM}<V_{SET}$), the second resistance random access memory member 510 is kept at the RESET state. The resistance in the first resistance random access memory member 410 changes from the logic "0" state (or "00" state) having the resistance of (1+f)R to the logic "2" state (or "10" state) having the resistance of (1+nf)R. For example, if the variable f=2, the variable n=10, and the RESET resistance of the second resistance random access memory member 510 is equal to R, the amount of resistance would change from 3 R to 21 R.

In programming the bistable resistance random access memory 600 from logic "0" state (or "00" state) to "3" state (or "11" state) state, a first voltage is applied on a first bit line to the first bit line voltage $V_{b1}$ 1320 and a second voltage is applied on a second bit line to the second bit line voltage $V_{b2}$ 1330. The voltage applied to the first bit line voltage $V_{b1}$ 1320 can be either zero volts, or a small negative voltage. The initial state for both the first resistance random access member 410 and the second resistance random access member 510 is a RESET state, i.e, a low resistance state. The voltage difference between the first bit line voltage $V_{b1}$ 1320 and the second bit line voltage $V_{b2}$ 1330 is sufficiently high ($V_{high}$) so that both the first resistance random access member voltage $V_{1RRAM}$ 1312 and the second resistance random access member voltage $V_{2RRAM}$ 1314 are higher than $V_{SET}$ for both the first resistance random access memory member 410 and the second resistance random access memory member 510. Both the first resistance random access memory member 410 and the second resistance random access memory member 510 change resistance state from the RESET state to the SET state. The resistance in the first and second resistance random access memory members 410, 510 changes from the logic "0" state ("00" state) having the resistance of (1+f)R to the logic "3" state ("11" state) having the resistance of n(1+f)R. For example, if the variable f=2, the variable n=10, and the RESET resistance of the second resistance random access memory member 510 is equal to R, the amount of resistance would change from 3 R to 30 R.

In programming the bistable resistance random access memory 600 from the logic "0" state (or "00" state) to the "1" state (or "01" state), the bistable random access memory 600 first goes through the sequence in changing from the logic "0" state (or "00" state) to the logic "3" state (or "11" state) in which both the first and second resistance random access memory members 410, 510 are changed from a RESET state to SET state The voltage applied to the second bit line voltage $V_{b2}$ 1330 can be either zero volts or a small negative voltage, represented mathematically as follows: $V_{b2}-V_{b1}=-V_{low}<0$. The first bit line voltage $V_{b1}$ 1320 is supplied with a positive voltage. At the SET state, the first resistance random access memory member 410 has a smaller area than the second resistance random access memory member 510 so that the first resistance random access memory member 410 has a higher resistance than the second resistance random access memory member 510. This in turn means that a higher voltage drop occurs across the first resistance random access memory member 410, represented mathematically as $|V_{1RRAM}|>|V_{2RRAM}|$. If the absolute value of the first resistance random access memory voltage $V_{1RRAM}$ 1312 is greater than the RESET voltage ($|V_{1RRAM}|>V_{RESET}$), the first resistance random access memory voltage 410 is changed to the RESET state (low resistance). If the absolute value of the second resistance random access memory voltage $V_{2RRAM}$ 1314 is less than the RESET voltage ($|V_{2RRAM}|<V_{RESET}$), the second resistance random access memory member 510 is maintained at the SET state. The resistance in the first and second resistance random access memory members 410, 510 changes from the logic "3" state (or "11" state) having the resistance of n(1+f)R to the logic "1" state (or "01" state) having the resistance of (n+f)R. For example, if the variable f=2, the variable n=10, and the RESET resistance of the second resistance random access memory member 510 is equal to R, the amount of resistance would change from 3 R to 30 R when the logic state changes from "0" to "3", and change from 30 R to 12 R when the logic state changes from "3" to "1".

The two resistances, $R_1$ 1310 and $R_2$ 1312, are arranged in series between two bit lines, $BL_1$ 1340 and $BL_2$ 1342. Voltage applied to the respective bit lines is indicated by $V_{b1}$ 1320 and $V_{b2}$ 1330 respectively, and the voltage drop across the two resistances is $V_{1RRAM}$ 1312 and $V_{2RRAM}$ 1314 the voltage drop between the two bit lines is thus $V_{b2}-V_{b1}$, which equals $V_{1RRAM}+V_{2RRAM}$. As indicated on the drawing, the area of first RRAM member 410 is smaller than that of the second RRAM member 510, and therefore the resistance $R_1$ is greater than $R_2$.

TABLE 1

| States/Values | | |
|---|---|---|
| $R_1$ | $R_2$ | Cell Value |
| RESET | RESET | 0 ("00") |
| RESET | SET | 1 ("01") |
| SET | RESET | 2 ("10") |
| SET | SET | 3 ("11") |

Combinations of RRAM states, and their resulting cell values, are shown in Table 1. The cell values correspond to relative overall resistance values.

It should be noted that the embodiment shown in Table 1 follows a "small-endian" structure. That is, the last element is the least significant digit (LSD) and the first is the most significant digit (MSD). Other embodiments follow a "big-endian" model, in which the digits were reversed, and in which the processes set out below are identical, but the two memory elements are reversed.

Derivation of expressions that describe the relationships present at each cell state are shown in FIGS. 8A-8D. FIG. 8A depicts the cell with first memory element $M_1$, comprising the resistive random access memory member 410 and conductive member 420 and second memory element $M_2$, comprising the resistive random access memory member 510 and the conductive member 520. There, both members are in a RESET state, having low resistance. If R is taken as the resistance of the larger RRAM member 510, then the other RRAM member 410 has a resistance value related to that of RRAM member 510 by a constant f. In the embodiment shown, the RRAM member 410 has a higher resistance than does the RRAM member 510, and thus constant f is known to be greater than 1, but other embodiments set out the semantics in an opposite sense.

As depicted, the difference in resistance that appears in the embodiment of FIGS. 8A-8D results from a difference in size of the two RRAM members. The smaller RRAM member has the higher resistance value. In other embodiments (not shown) an operationally identical resistance differential could be obtained by employing different materials for the two elements. The structural difference between the two embodiments would not affect the expression of their relationships, however, as the difference would still be captured by the constant f. In the embodiment here, the two RRAM members are about the same thickness (as set out in more detail below), but their width differs, and that difference produces the difference in resistance.

The two RRAM members are arranged in series, and therefore the resistance of the cell as a whole can be expressed as R+fR, or (1+f)R. Conversion of the low-order element $M_2$ to a SET state, having a relatively high resistance level, is shown in FIG. 8B. There, the resistance level rises by an amount proportional to a constant n. Different materials will exhibit different constants, based on the properties of the particular compound or allow chosen, but for a given material the relationship between RESET and SET states can be expressed by the relationship shown in FIG. 8B, R→nR. Thus, the state depicted in FIG. 8B can be described by the expression fR+nR, or (n+f)R.

Similarly, FIG. 8C depicts the result of converting RRAM element $M_2$ to a SET state, leaving $M_1$ at RESET. In the embodiment shown, with the two members formed from the same material, the constant n will describe the difference between SET and RESET values, allowing one to describe the resistance value by nfR. That leads to the overall expression (1+nf)R to describe the resistance value of the cell.

Finally, FIG. 8D illustrates the result of converting both RRAM members $M_1$ and $M_2$ to a SET state, producing transitions R→nR (for $M_2$) and fR→nfR (for $M_1$). The state can be expressed as nR+nfR, or n(1+f)R.

The semantic relationships associated with the four cell values are summarized in Table 2, below.

TABLE 2

| Cell Value Relationship | |
|---|---|
| Relationship | Cell Value |
| (1 + f)R | 0 ("00") |
| (n + f)R | 1 ("01") |
| (1 + nf)R | 2 ("10") |
| n(1 + f)R | 3 ("11") |

An example of sensing operation window can be achieved by setting the values of parameters n, f, and R. If $R=10^4 \Omega$, n=10, and f=2, the resistance of four states can be characterized as $3 \times 10^4 \Omega$, $1.2 \times 10^5 \Omega$, $2.1 \times 10^5 \Omega$, and $3 \times 10^5 \Omega$. For a sensing voltage (the read voltage) of 120 mV, the sensed current for the four states are 4 μA, 1 μA, 0.6 μA, and 0.4 μA, respectively. The division voltages for multiple levels operation can be set as 2.5 μA, 0.8 μA, and 0.5 μA. For the sensing current of higher than 2.5 μA, a lowest resistance state can be defined as the "0" state (or "00" state). For the sensing current less than 0.5 μA, a highest resistance state can be defined as the "3" state (or "11" state). For the sensing current higher than 0.8 μA, but less than 2.5 μA, a low resistance state can be defined as the "1" state (or "01" state). For the sensing current higher than 0.5 μA, but less than 0.8 μA, a high resistance state can be defined as the "2" state (or "10" state). The variation of the sensing current depends on both the processing variation and the material intrinsic variation. For instance, the thickness (or width) variation of the dielectric spacer determines the area variation of the second resistance random access memory member, which in turn determines the resistance of the second resistance random access memory member. Hence, a wide operation window is desirable to perform a high quality multi-bit RRAM. A higher constant n and higher coefficient f can provide a wider operation window, thereby preventing the product from state determination failure.

Setting the memory cell to a desired value is accomplished by applying voltage across the bit lines $BL_1$ and $BL_2$. A total of four voltages suffice to accomplish all possible values shown in Table 1. Those in the art will understand that a number of possibilities exist for the actual voltages. In one embodiment, two positive voltages (where positive is measured at $V_{b2}$ with respect to $V_{b1}$) and two negative voltages are employed, the resulting voltages being labeled $V_{high}$, $V_{low}$, $-V_{high}$ and $-V_{low}$. The absolute values of applied voltage will depend on the characteristics of the memory members involved, including the materials and sizes employed. In the embodiment shown, a HIGH value of 3.3 volts and a LOW value of 1.5 volts have proven effective.

The first procedure is the general RESET, which drives both RRAM members to the RESET state, producing a cell value of 0. This procedure is shown in Table 3, below.

TABLE 3

Transition RESET all
$(V_{b2} - V_{b1}) = -V_{high}$

| | Element State | Cell | Action | Element State | Cell |
|---|---|---|---|---|---|
| $M_1$ | 1 | 3 | $|V_1| > V_{RESET}$ | 0 | 0 |
| $M_2$ | 1 | | $|V_2| > V_{RESET}$ | 0 | |

As shown, the appropriate voltage for this transition is $-V_{high}$, such that the absolute values of the voltage drops $V_{1RRAM}$ and $V_{2RRAM}$ each exceeds the RESET value. With both RRAM members in RESET state, the overall value of the cell is then 0.

The RESET condition is the starting point for all further operations. Because unpredictable results could occur in transitions between intermediate states, it is preferred to reduce the unit to a RESET condition as the first step in any state change operation.

The opposite condition, a cell value of 3, is shown in Table 4, below.

TABLE 4

Transition 0-3
$(V_{b2} - V_{b1}) = V_{high}$

| | Element State | Cell | Action | Element State | Cell |
|---|---|---|---|---|---|
| $M_1$ | 0 | 0 | $V_1 > V_{SET}$ | 1 | 3 |
| $M_2$ | 0 | | $V_2 > V_{SET}$ | 1 | |

There, the $V_{high}$ voltage is applied, sufficient to produce voltage drops exceeding $V_{SET}$ for both members. With both members in the SET state, the cell value is binary 11, or 3.

To produce a cell value of 2, the process shown in Table 5, below, is followed.

TABLE 5

Transition 0-2
$(V_{b2} - V_{b1}) = V_{low}$

| | Element State | Cell | Action | Element State | Cell |
|---|---|---|---|---|---|
| $M_1$ | 0 | 0 | $V_1 > V_{SET}$ | 1 | 2 |
| $M_2$ | 0 | | $V_2 < V_{SET}$ | 0 | |

At this setting, the voltage drop $V_1$ is greater than that required to produce a SET condition, so $R_1$ is SET, but the voltage drop $V_2$ is less than the SET requirement, leaving that element in a RESET condition. The result places $R_1$ in a SET condition, with $R_2$ in RESET, resulting in a cell value of binary 01, or 2.

Producing a cell value of 1 is illustrated in Table 6, below. Arriving at a 1 value is more difficult than the other transitions, as it is intuitively obvious that if one starts with both members at RESET, application of a voltage sufficient to produce a SET condition in $V_2$ would necessarily also SET $V_1$, resulting in a value of 3, not 1. The solution is first to bring the cell to a fully SET state, as shown in Table 3 above. Then, starting from a cell value of 3, a $-V_{low}$ voltage is applied, sufficient to produce a RESET in $R_1$ but not $R_2$, producing a cell value of binary 01, or 1.

TABLE 6

Transition 3-1
$(V_{b2} - V_{b1}) = -V_{low}$

| | Element State | Cell | Action | Element State | Cell |
|---|---|---|---|---|---|
| $M_1$ | 1 | 3 | $|V_1| > V_{RESET}$ | 0 | 1 |
| $M_2$ | 1 | | $|V_2| < V_{RESET}$ | 1 | |

Figure 14:
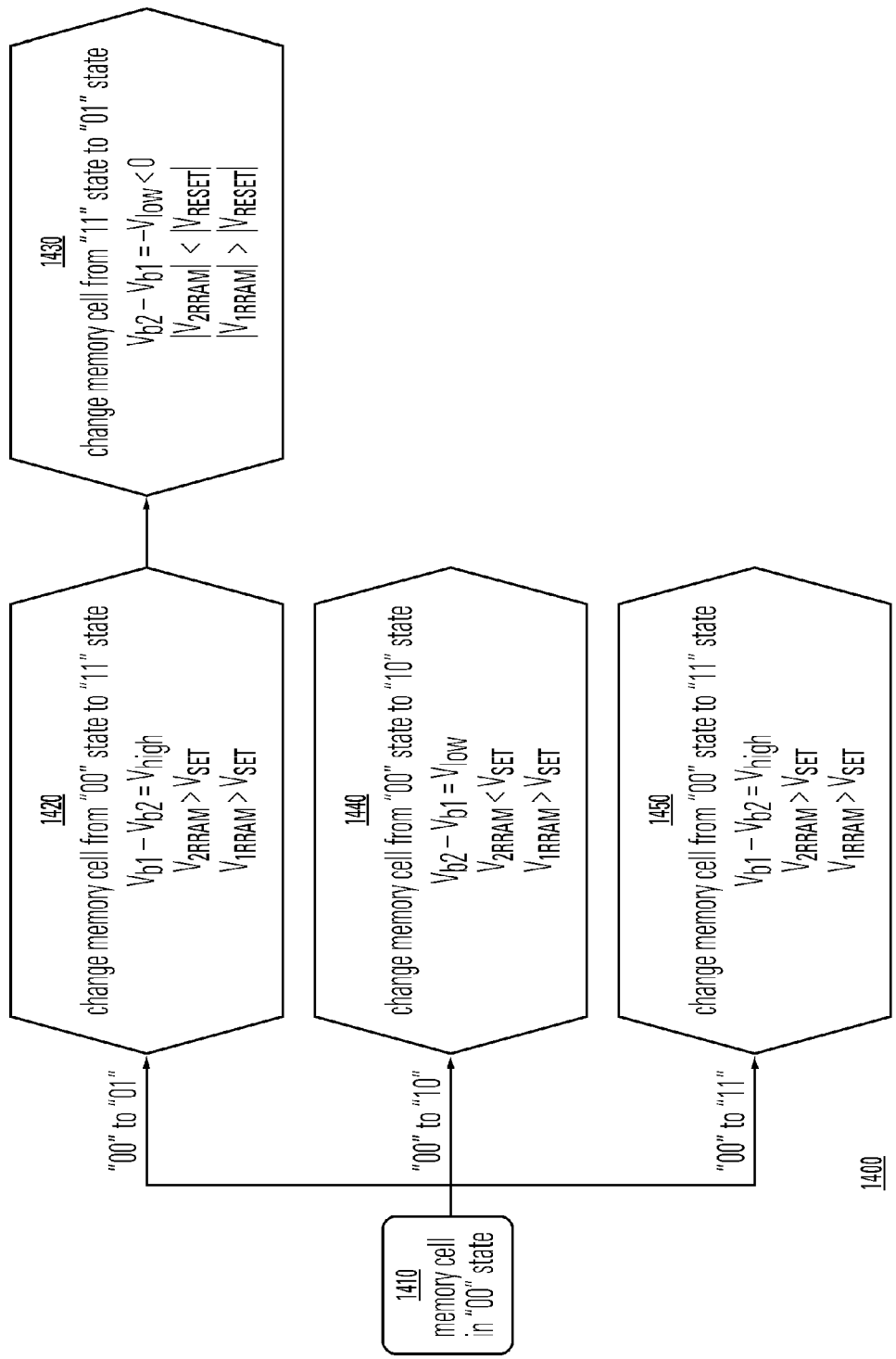
FIG. 14 is a flow diagram illustrating the programming of the bistableresistance random access memory from the logic "00" state to the three other logic states, the logic "01" state, the logic "10" state, and the logic "11" state in accordance with the present invention.

FIG. 14 is a flow diagram 1400 illustrating the programming of the bistable resistance random access memory 600 from the logic "00" state to the three other logic states, the logic "01" state, the logic "10" state, and the logic "11" state. At step 1410, the bistable resistance random access memory 600 is in the logic "00" state. If the bistable resistance random access memory 600 is programmed from the logic "00" state to the logic "01" state, the bistable resistance random access memory 600 is first programmed from the logic "00" state to the "11" state at step 1420, and second programmed from the logic "11" state at to the logic "01" state at step 1430. At step 1420 in which the bistable resistance random access memory 600 is programmed from the logic "00" state to the logic "11" state, the differential voltage between the first bit line voltage $V_{b1}$ 1320 and the second bit line voltage $V_{b2}$ 1330 is equal to a high voltage $V_{high}$, represented mathematically as $V_{b1} - V_{b2} = V_{high}$, the second resistance random access memory voltage $V_{2RRAM}$ 1314 is greater than the $V_{SET}$ voltage, and the first resistance random access memory voltage $V_{1RRAM}$ 1312 is greater than the $V_{SET}$ voltage. At step 1430 in which the bistable resistance random access memory 600 is programmed from the logic "11" state to the logic "01" state, the differential voltage between the first bit line voltage $V_{b1}$ 1320 and the second bit line voltage $V_{b2}$ 1330 is equal to a negative low voltage $-V_{low}$, represented mathematically as $V_{b2} - V_{b1} = -V_{low}$, the absolute value of the second resistance random access memory voltage $V_{2RRAM}$ 1314 is less than the absolute value of the $V_{RESET}$ voltage, and the absolute value of the first resistance random access memory voltage $V_{1RRAM}$ 1312 is greater than the absolute value of the $V_{RESET}$ voltage.

At step 1440 in which the bistable resistance random access memory 600 is programmed from the logic "00" state to the logic "10" state, the differential voltage between the first bit line voltage $V_{b1}$ 1320 and the second bit line voltage $V_{b2}$ 1330 is equal to a low voltage $V_{low}$, represented mathematically as $V_{b2} - V_{b1} = V_{low}$, the second resistance random access memory voltage $V_{2RRAM}$ 1314 is less than the $V_{SET}$ voltage, and the first resistance random access memory voltage $V_{1RRAM}$ 1312 is greater than the $V_{SET}$ voltage. At step 1450 in which the bistable resistance random access memory 600 is programmed from the logic "00" state to the logic "11" state, the differential voltage between the first bit line voltage $V_{b1}$ 1320 and the second bit line voltage $V_{b2}$ 1330 is equal to the high voltage $V_{high}$, represented mathematically as $V_{b1} - V_{b2} = V_{high}$, the second resistance random access memory voltage $V_{2RRAM}$ 1314 is greater than the $V_{SET}$ voltage, and the first resistance random access memory voltage $V_{1RRAM}$ 1312 is greater than the $V_{SET}$ voltage.

Figure 15:
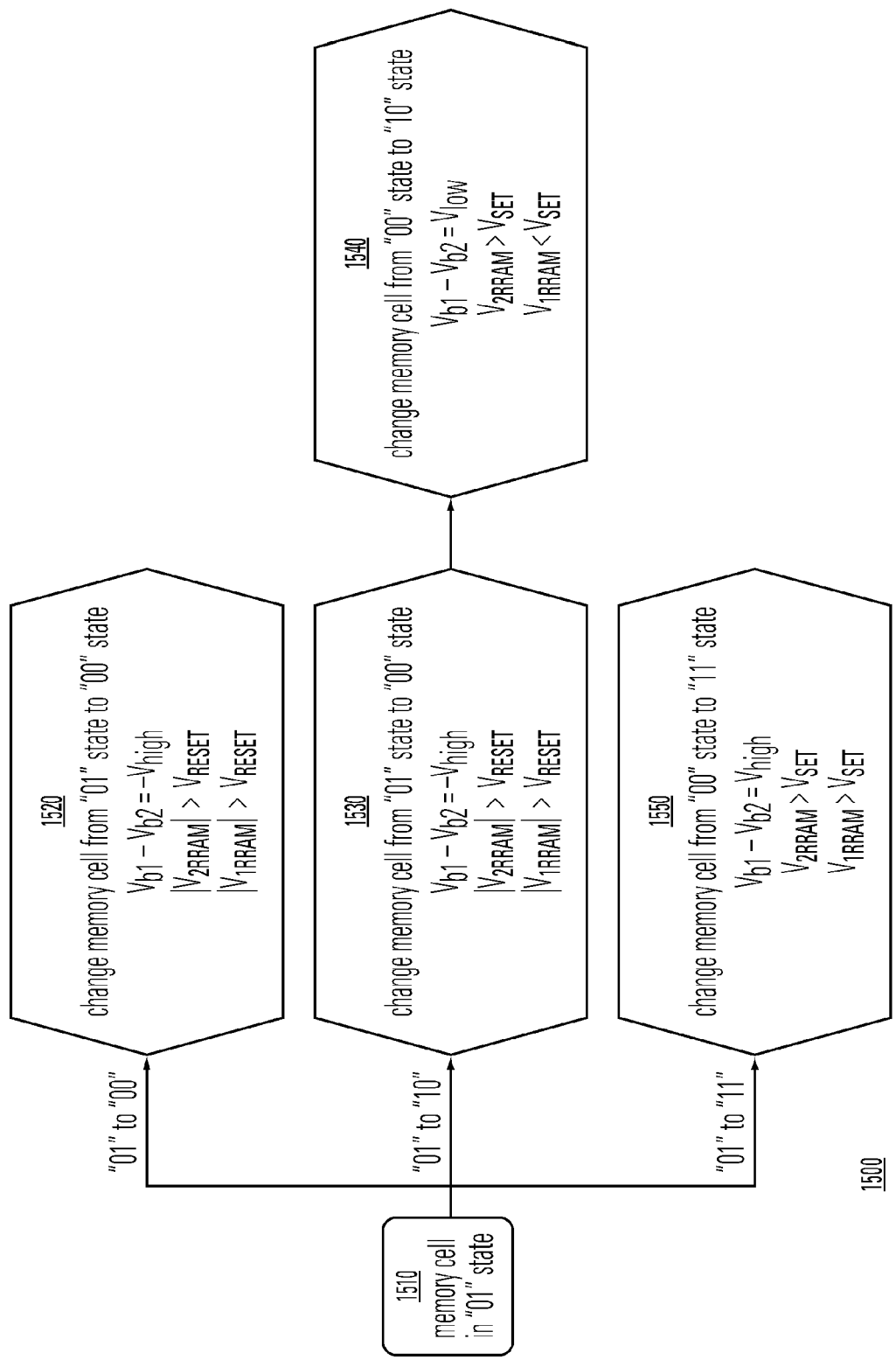
FIG. 15 is a flow diagram illustrating the programming of the bistable resistance random access memory from the logic "01" state to the three other logic states, the logic "00" state, the logic "10" state, and the logic "11" state in accordance with the present invention.

FIG. 15 is a flow diagram 1500 illustrating the programming of the bistable resistance random access memory 600 from the logic "01" state to the three other logic states, the logic "00" state, the logic "10" state, and the logic "11" state. At step 1510, the bistable resistance random access memory 600 is in the logic "01". At step 1520 in which the bistable resistance random access memory 600 is programmed from the logic "01" state to the logic "00" state, the differential voltage between the first bit line voltage $V_{b1}$ 1320 and the second bit line voltage $V_{b2}$ 1330 is equal to a negative high voltage $-V_{high}$, represented mathematically as $V_{b1}-V_{b2}=-V_{high}$, the absolute value of the second resistance random access memory voltage $V_{2RRAM}$ 1314 is greater than the $V_{RESET}$ voltage, and the absolute value of the first resistance random access memory voltage $V_{1RRAM}$ 1312 is greater than the $V_{RESET}$ voltage.

If the bistable resistance random access memory 600 is programmed from the logic "01" state to the logic "10" state, the bistable resistance random access memory 600 is first programmed from the logic "01" state to the "00" state at step 1530, and second programmed from the logic "00" state at to the logic "10" state at step 1540. At step 1530 in which the bistable resistance random access memory 600 is programmed from the logic "01" state to the logic "00" state, the differential voltage between the first bit line voltage $V_{b1}$ 1320 and the second bit line voltage $V_{b2}$ 1330 is equal to a negative high voltage $-V_{high}$, represented mathematically as $V_{b1}-V_{b2}=-V_{high}$, the absolute value of the second resistance random access memory voltage $V_{2RRAM}$ 1314 is greater than the $V_{RESET}$ voltage, and the absolute value of the first resistance random access memory voltage $V_{1RRAM}$ 1312 is greater than the $V_{RESET}$ voltage. At step 1540 in which the bistable resistance random access memory 600 is programmed from the logic "00" state to the logic "10" state, the differential voltage between the first bit line voltage $V_{b1}$ 1320 and the second bit line voltage $V_{b2}$ 1330 is equal to the low voltage $V_{low}$, represented mathematically as $V_{b1}-V_{b2}=V_{low}$, the second resistance random access memory voltage $V_{2RRAM}$ 1314 is greater than the $V_{RESET}$ voltage, and the first resistance random access memory voltage $V_{1RRAM}$ 1312 is less than the $V_{RESET}$ voltage.

At step 1550 in which the bistable resistance random access memory 600 is programmed from the logic "01" state to the logic "11" state, the differential voltage between the first bit line voltage $V_{b1}$ 1320 and the second bit line voltage $V_{b2}$ 1330 is equal to the high voltage $V_{high}$, represented mathematically as $V_{b1}-V_{b2}=V_{high}$, the second resistance random access memory voltage $V_{2RRAM}$ 1314 is greater than the $V_{SET}$ voltage, and the first resistance random access memory voltage $V_{1RRAM}$ 1312 is greater than the $V_{SET}$ voltage.

Figure 16:
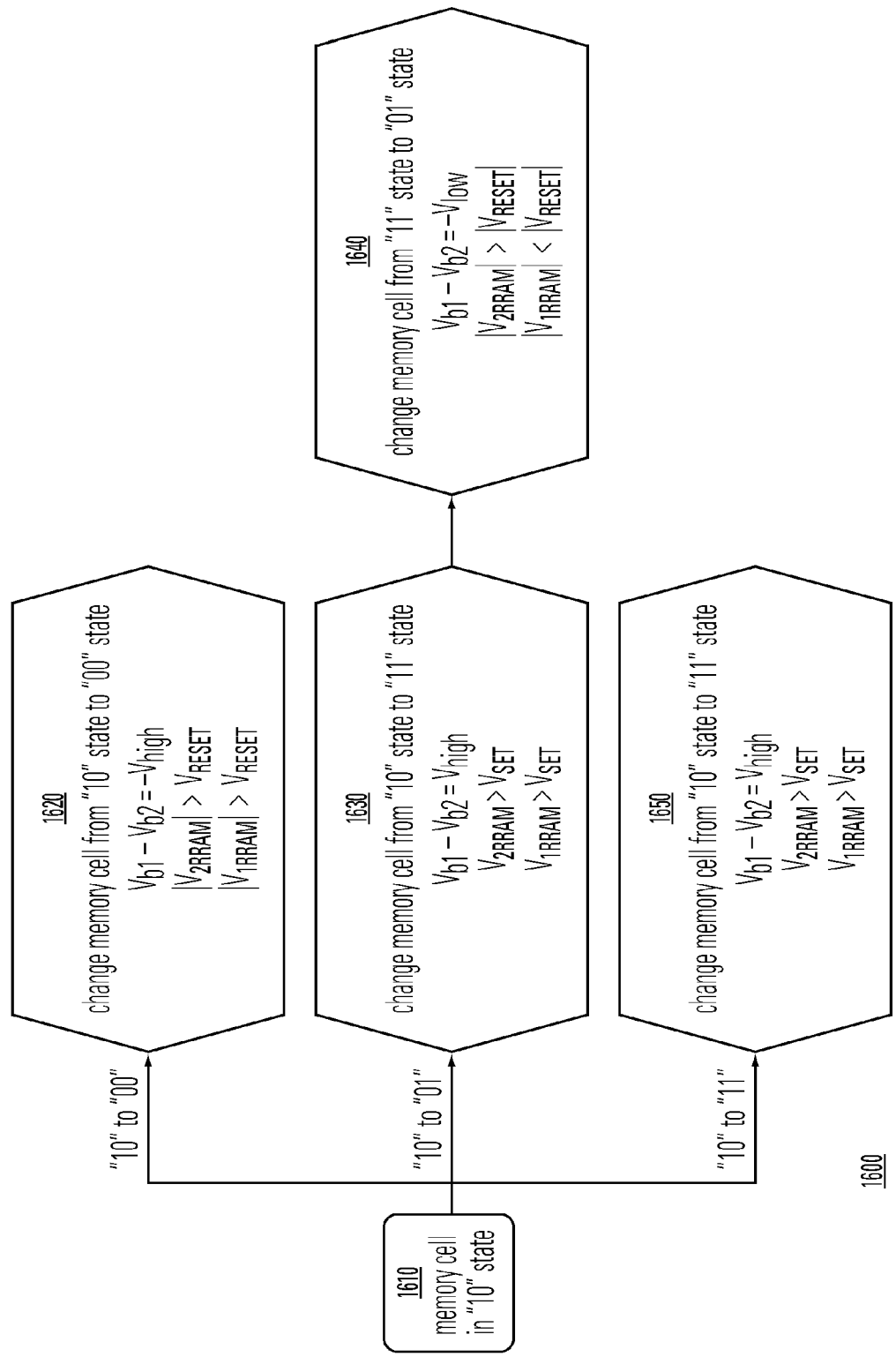
FIG. 16 is a flow diagram illustrating the programming of the bistable resistance random access memory from the logic "10" state to the three other logic states, the logic "00" state, the logic "01" state, and the logic "11" state in accordance with the present invention.

FIG. 16 is a flow diagram 1600 illustrating the programming of the bistable resistance random access memory 600 from the logic "10" state to the three other logic states, the logic "00" state, the logic "01" state, and the logic "11" state. At step 1610, the bistable resistance random access memory 600 is in the logic "10". At step 1620 in which the bistable resistance random access memory 600 is programmed from the logic "10" state to the logic "00" state, the differential voltage between the first bit line voltage $V_{b1}$ 1320 and the second bit line voltage $V_{b2}$ 1330 is equal to a negative high voltage $-V_{high}$, represented mathematically as $V_{b1}-V_{b2}=-V_{high}$, the absolute value of the second resistance random access memory voltage $V_{2RRAM}$ 1314 is greater than the $V_{RESET}$ voltage, and the absolute value of the first resistance random access memory voltage $V_{1RRAM}$ 1312 is greater than the $V_{RESET}$ voltage.

If the bistable resistance random access memory 600 is programmed from the logic "10" state to the logic "01" state, the bistable resistance random access memory 600 is first programmed from the logic "10" state to the "11" state at step 1630, and second programmed from the logic "11" state at to the logic "01" state at step 1640. At step 1630 in which the bistable resistance random access memory 600 is programmed from the logic "10" state to the logic "11" state, the differential voltage between the first bit line voltage $V_{b1}$ 1320 and the second bit line voltage $V_{b2}$ 1330 is equal to a high voltage $V_{high}$, represented mathematically as $V_{b1}-V_{b2}=V_{high}$, the second resistance random access memory voltage $V_{2RRAM}$ 1314 is greater than the $V_{SET}$ voltage, and the first resistance random access memory voltage $V_{1RRAM}$ 1312 is greater than the $V_{SET}$ voltage. At step 1640 in which the bistable resistance random access memory 600 is programmed from the logic "11" state to the logic "10" state, the differential voltage between the first bit line voltage $V_{b1}$ 1320 and the second bit line voltage $V_{b2}$ 1330 is equal to the negative low voltage $-V_{low}$, represented mathematically as $V_{b1}-V_{b2}=-V_{low}$, the absolute value of the second resistance random access memory voltage $V_{2RRAM}$ 1314 is greater than the absolute value of the $V_{RESET}$ voltage, and the absolute value of the first resistance random access memory voltage $V_{1RRAM}$ 1312 is less than the absolute value of the $V_{RESET}$ voltage.

At step 1650 in which the bistable resistance random access memory 600 is programmed from the logic "10" state to the logic "11" state, the differential voltage between the first bit line voltage $V_{b1}$ 1320 and the second bit line voltage $V_{b2}$ 1330 is equal to the high voltage $V_{high}$, represented mathematically as $V_{b1}-V_{b2}=V_{high}$, the second resistance random access memory voltage $V_{2RRAM}$ 1314 is greater than the $V_{SET}$ voltage, and the first resistance random access memory voltage $V_{1RRAM}$ 1312 is greater than the $V_{SET}$ voltage.

Figure 17:
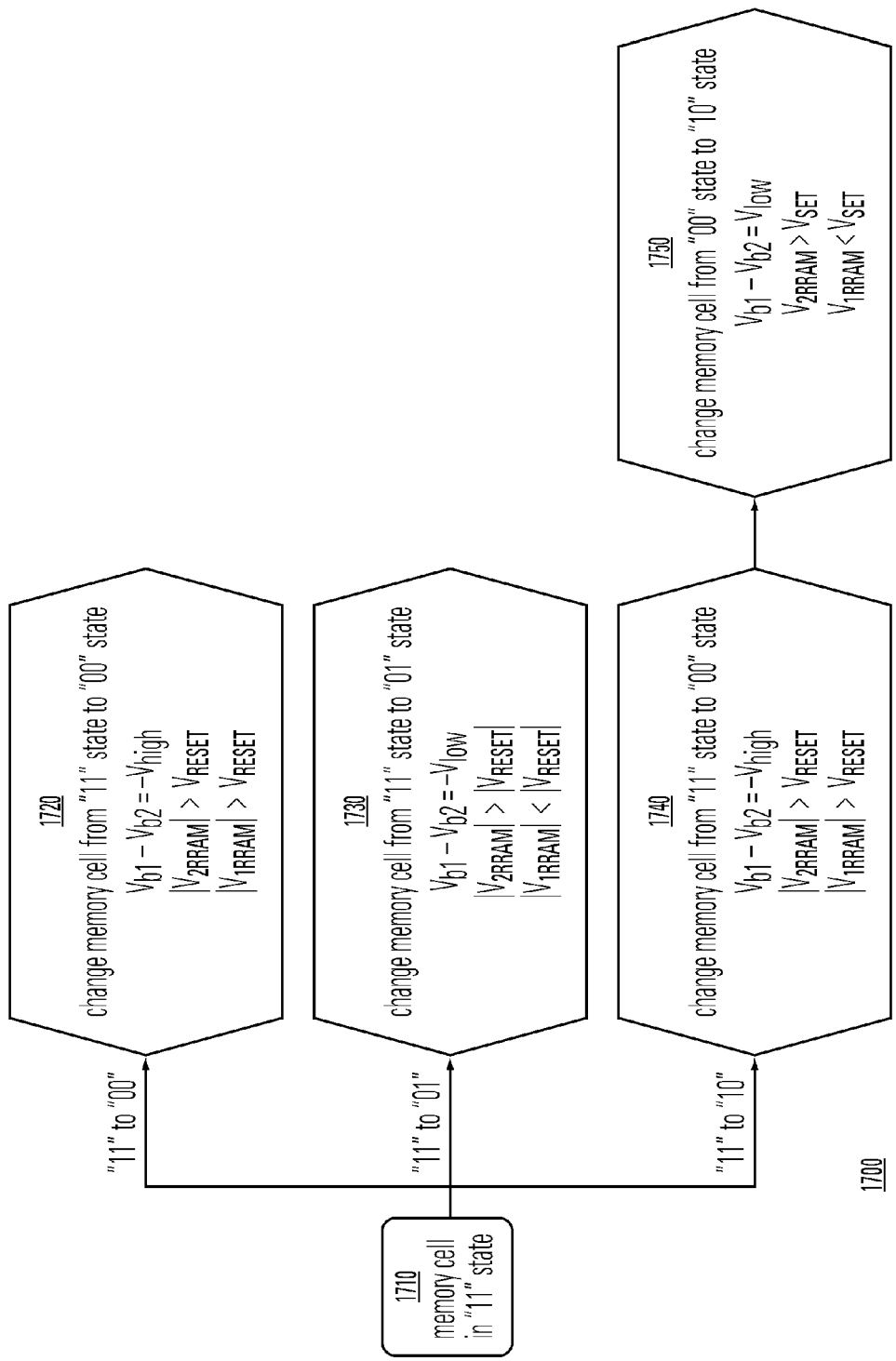
FIG. 17 is a flow diagram illustrating the programming of the bistable resistance random access memory from the logic "11" state to the three other logic states, the logic "00" state, the logic "01" state, and the logic "10" state in accordance with the present invention.

FIG. 17 is a flow diagram 1700 illustrating the programming of the bistable resistance random access memory 600 from the logic "11" state to the three other logic states, the logic "00" state, the logic "01" state, and the logic "10" state. At step 1710, the bistable resistance random access memory 600 is in the logic "11". At step 1720 in which the bistable resistance random access memory 600 is programmed from the logic "11" state to the logic "00" state, the differential voltage between the first bit line voltage $V_{b1}$ 1320 and the second bit line voltage $V_{b2}$ 1330 is equal to a negative high voltage $-V_{high}$, represented mathematically as $V_{b1}-V_{b2}=-V_{high}$, the absolute value of the second resistance random access memory voltage $V_{2RRAM}$ 1314 is greater than the $V_{RESET}$ voltage, and the absolute value of the first resistance random access memory voltage $V_{1RRAM}$ 1312 is greater than the $V_{RESET}$ voltage.

At step 1730 in which the bistable resistance random access memory 600 is programmed from the logic "11" state to the logic "01" state, the differential voltage between the first bit line voltage $V_{b1}$ 1320 and the second bit line voltage $V_{b2}$ 1330 is equal to the negative low voltage $-V_{low}$, represented mathematically as $V_{b1}-V_{b2}=-V_{low}$, the absolute value of the second resistance random access memory voltage $V_{2RRAM}$ 1314 is greater than the absolute value of the $V_{RESET}$ voltage, and the absolute value of the first resistance random access memory voltage $V_{1RRAM}$ 1312 is less than the absolute value of the $V_{RESET}$ voltage.

If the bistable resistance random access memory 600 is programmed from the logic "11" state to the logic "10" state, the bistable resistance random access memory 600 is first programmed from the logic "11" state to the "00" state at step 1740, and second programmed from the logic "00" state at to the logic "10" state at step 1750. At step 1740 in which the bistable resistance random access memory 600 is programmed from the logic "11" state to the logic "00" state, the differential voltage between the first bit line voltage $V_{b1}$ 1320 and the second bit line voltage $V_{b2}$ 1330 is equal to the negative high voltage $-V_{high}$, represented mathematically as $V_{b1}-V_{b2}=-V_{high}$, the absolute value of the second resistance random access memory voltage $V_{2RRAM}$ 1314 is greater than the $V_{RESET}$ voltage, and the absolute value of the first resistance random access memory voltage $V_{1RRAM}$ 1312 is greater than the $V_{RESET}$ voltage. At step 1750 in which the bistable resistance random access memory 600 is programmed from the logic "00" state to the logic "10" state, the differential voltage between the first bit line voltage $V_{b1}$ 1320 and the second bit line voltage $V_{b2}$ 1330 is equal to the negative low voltage $V_{low}$, represented mathematically as $V_{b1}-V_{b2}=V_{low}$, the second resistance random access memory voltage $V_{2RRAM}$ 1314 is greater than the $V_{SET}$ voltage, and the first resistance random access memory voltage $V_{1RRAM}$ 1312 is less than the $V_{SET}$ voltage.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A memory device, comprising:
  a first memory member and a second memory member arranged in electrical series;
  a first logic state corresponding to a first resistance state of the first memory member and a first resistance state of the second memory member;
  a second logic state corresponding to the first resistance state of the first memory member and a second resistance state of the second memory member; and
  a third logic state corresponding to a second resistance state of the first memory member and the first resistance state of the second memory member.

2. The memory device of claim 1, further comprising circuitry to apply voltage schemes across the series arrangement of the first and second memory members to change logic states of the memory device, the voltage schemes including:
  a first voltage scheme to change the memory device from the first logic state to the second logic state; and
  a second voltage scheme to change the memory device from the first logic state to the third logic state.

3. The memory device of claim 2, wherein the voltage schemes include a third voltage scheme to change the memory device from the first logic state to a fourth logic state, the fourth logic state corresponding to the second resistance state of the first memory member and the second resistance state of the second memory member.

4. The memory device of claim 3, wherein the third voltage scheme comprises:
  a first voltage applied across the series arrangement of the first and second memory members to change the memory device from the first logic state to a transition state, the first voltage adapted to maintain the resistance state of the first memory member and change the resistance state of the second memory member; and
  a second voltage applied across the series arrangement of the first and second memory members to change the memory device from the transition state to the fourth logic state, the second voltage adapted to change the resistance state of the first memory member and maintain the resistance state of the second memory member.

5. The memory device of claim 4, wherein the second logic state and the transition state correspond to the same resistance state of the first memory member and the same resistance state of the second memory member.

6. The memory device of claim 2, wherein the first voltage scheme comprises:
  a first voltage applied across the series arrangement of the first and second memory members to change the memory device from the first logic state to a transition state, the first voltage adapted to change the resistance states of both the first and second memory members; and
  a second voltage applied across the series arrangement of the first and second memory members to change the memory device from the transition state to the second logic state, the second voltage adapted to change the resistance state of the first memory member and maintain the resistance state of the second memory member.

7. The memory device of claim 6, wherein the second voltage scheme comprises a third voltage applied across the series arrangement of the first and second memory members to change the resistance state of the first memory member and maintain the resistance of the second memory member.

8. A memory device, comprising:
  a first memory member and a second memory member for defining multilevel memory states;
  a first memory state defined by a low resistance state of the first memory member and a low resistance state of the second memory member;
  a second memory state defined by a high resistance state of the first memory member and a high resistance state of the second memory member; and
  a third memory state defined by the low resistance state of the first memory member and the high resistance state of the second memory member.

9. The memory device of claim 8, further comprising circuitry to apply voltage schemes to the first and second memory members to change memory states of the memory device, the voltage schemes including:
  a first voltage scheme to change the memory device from the first memory state to the second memory state; and
  a second voltage scheme to change the memory device from the first memory state to the third memory state.

10. The memory device of claim 9, wherein the voltage schemes include a third voltage scheme to change the memory device from the first memory state to a fourth memory state, the fourth memory state defined by the high resistance state of the first memory member and the low resistance state of the second memory member.

11. The memory device of claim 10, wherein the third voltage scheme comprises:
  a first voltage applied to change the memory device from the first memory state to a transition state, the first voltage adapted to maintain the resistance state of the first memory member and change the resistance state of the second memory member; and
  a second voltage applied to change the memory device from the transition state to the fourth memory state, the second voltage adapted to change the resistance state of the first memory member and maintain the resistance state of the second memory member.

12. The memory device of claim 11, wherein the second memory state and the transition state correspond to the same resistance state of the first memory member and the same resistance state of the second memory member.

13. The memory device of claim 9, wherein the first voltage scheme comprises:
- a first voltage applied to change the memory device from the first memory state to a transition state, the first voltage adapted to change the resistance states of both the first and second memory members; and
- a second voltage applied to change the memory device from the transition state to the second memory state, the second voltage adapted to change the resistance state of the first memory member and maintain the resistance state of the second memory member.

14. The memory device of claim 13, wherein the second voltage scheme comprises a third voltage applied to change the resistance state of the first memory member and maintain the resistance of the second memory member.

* * * * *